(12) United States Patent
Moriwaki

(10) Patent No.: US 7,339,189 B2
(45) Date of Patent: Mar. 4, 2008

(54) SUBSTRATE FOR SEMICONDUCTOR DEVICE, METHOD OF MANUFACTURING SUBSTRATE FOR SEMICONDUCTOR DEVICE, SUBSTRATE FOR ELECTRO-OPTICAL DEVICE, ELECTRO-OPTICAL DEVICE, AND ELECTRONIC APPARATUS

(75) Inventor: Minoru Moriwaki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 175 days.

(21) Appl. No.: 11/165,038

(22) Filed: Jun. 24, 2005

(65) Prior Publication Data

US 2006/0011979 A1    Jan. 19, 2006

(30) Foreign Application Priority Data

Jul. 15, 2004    (JP) .............................. 2004-208437

(51) Int. Cl.
   *H01L 29/04*    (2006.01)
(52) U.S. Cl. .......................... 257/59; 257/72; 257/350; 257/E27.1; 257/E29.117
(58) Field of Classification Search ................. 257/59, 257/66, 72, 292, 294, 773, 774, E27.1, E29.117, 257/350, 351
   See application file for complete search history.

(56) References Cited

U.S. PATENT DOCUMENTS 6,136,624 A    10/2000  Kemmochi et al.

2005/0098894 A1*    5/2005  Ohtani et al. ............... 257/758

FOREIGN PATENT DOCUMENTS

| EP | 1-102-111 A2 | 5/2001 |
|----|------|------|
| JP | A 08-227939 | 9/1996 |
| JP | A 2002-108224 | 4/2002 |
| KR | 2001-51728 | 6/2001 |
| KR | 10-344206 | 7/2002 |

* cited by examiner

*Primary Examiner*—Howard Weiss
*Assistant Examiner*—(Vikki) Hoa B Trinh
(74) *Attorney, Agent, or Firm*—Oliff & Berridge, PLC

(57) ABSTRACT

A substrate for a semiconductor device includes a substrate, a thin film transistor that is provided on the substrate, a wiring line that is provided above the thin film transistor, an interlayer insulating film that electrically isolates the wiring line from at least a semiconductor layer of the thin film transistor, and a contact hole that has a first hole being cut in the interlayer insulating film and extending in a longitudinal direction in plan view on a substrate surface and a plurality of second holes passing through the interlayer insulating film from a bottom of the first hole to reach a surface of the semiconductor layer and being arranged in the longitudinal direction of the first hole. The connect hole connects the wiring line to the semiconductor layer via the interlayer insulating film.

9 Claims, 19 Drawing Sheets

SUBSTRATE FOR SEMICONDUCTOR DEVICE, METHOD OF MANUFACTURING SUBSTRATE FOR SEMICONDUCTOR DEVICE, SUBSTRATE FOR ELECTRO-OPTICAL DEVICE, ELECTRO-OPTICAL DEVICE, AND ELECTRONIC APPARATUS

This application claims the benefit of prior Japanese Patent Application No. 2004-208437, filed Jul. 15, 2004.

BACKGROUND OF THE INVENTION

1. Technical Field

The present invention relates to a substrate for a semiconductor device in which a contact hole is provided in a laminated structure on the substrate and that is used for an electro-optical device, such as a liquid crystal device or the like, to a method of manufacturing the substrate for a semiconductor device, to a substrate for an electro-optical device that has such a substrate for a semiconductor device, to an electro-optical device that has such a substrate for an electro-optical device, and to an electronic apparatus, such as a projector, or the like.

2. Related Art

In Japanese Unexamined Patent Application Publication No. 8-227939, a substrate for a semiconductor device in which a multi-layered wiring line is formed using a stack contact is disclosed. Further, in Japanese Unexamined Patent Application Publication No. 2002-108244, an electro-optical device that has such a substrate for a semiconductor device is disclosed. In the electro-optical device, a driving circuit that drives a plurality of pixel portions formed in an image display region on the substrate is formed in a peripheral region disposed in the periphery of the image display region. In the driving circuit, a stack contact which connects a semiconductor layer of a thin film transistor serving as a circuit element to a wiring line is formed to pass through, for example, a two-layered interlayer insulating film. More specifically, a contact hole has a first hole formed in an upper interlayer insulating film from the two-layered interlayer insulating film and a second hole formed to pass through a lower interlayer insulating film from the bottom of the first hole. Then, in the contact hole, a conductive material is continuously film-formed from the surface of the upper interlayer insulating film so as to form the wiring line. At this time, a portion of the wiring line formed in the contact hole is formed so as to serve as a stack contact. Through such a stack contact, a source and a drain of the thin film transistor are electrically connected to the wiring line.

Here, in the design of the thin film transistor, the ratio between the channel length and the channel width of the thin film transistor may be adjusted so as to increase mobility. Further, a plurality of stack contacts may be formed with respect to the source and the drain of the thin film transistor. Thus, the parasitic capacitance of the thin film transistor can be reduced and the on current can be increased.

With respect to adjacent contact holes from the plurality of contact holes formed in the semiconductor layer, the wiring line may be continuously formed from one contact hole to other contact holes, such that the plurality of contact holes can be electrically connected to one another. Accordingly, the wiring line for electrically connecting the plurality of contact holes to one another becomes relatively long. For this reason, when an electro-optical device is driven, the contact resistance between a part of the wiring line formed in the contact hole or another part of the wiring line formed on the surface of the interlayer insulating film and the interlayer insulating film and the contact resistance of the wiring line to the semiconductor layer in the contact hole may be relatively large. As such, if the contact resistance is increased, only some of the plurality of stack contacts may be electrically connected. As a result, the on current may be decreased.

Accordingly, in order to solve this inconsistency, the wiring line preferably has a width sufficient to cover all contact holes as viewed from the substrate surface in plan view. Thus, a current path having low contact resistance can be ensured in portions excluding the contact holes. In this case, however, when the driving circuit is reduced in size by narrowing the pitch of the wiring line, an interlayer insulating film that electrically isolates the wiring line from an additional conductive layer formed above the wiring line may be cracked. Thus, there may be a problem in that the yield in manufacturing an electro-optical device is degraded.

SUMMARY

An advantage of the invention is that it provides a substrate for a semiconductor device that can suppress contact resistance in a stack contact, a method of manufacturing the substrate for a semiconductor device, a substrate for an electro-optical device that has such a substrate for a semiconductor device, an electro-optical device that has such a substrate for an electro-optical device, and an electronic apparatus.

According to a first aspect of the invention, a substrate for a semiconductor device includes a substrate, a thin film transistor that is provided on the substrate, a wiring line that is provided above the thin film transistor, an interlayer insulating film that electrically isolates the wiring line from at least a semiconductor layer of the thin film transistor, and a contact hole that has a first hole being cut in the interlayer insulating film and extending in a longitudinal direction as viewed from a substrate surface in plan view and a plurality of second holes passing through the interlayer insulating film from a bottom of the first hole to reach a surface of the semiconductor layer and being arranged in the longitudinal direction of the first hole, and that connects the wiring line to the semiconductor layer via the interlayer insulating film.

In accordance with the first aspect of the invention, on the substrate, the thin film transistor and the wiring line are electrically isolated from each other by a single or more-layered interlayer insulating film. In the interlayer insulating film, the contact hole that passes through the interlayer insulating film from a surface of the interlayer insulating film to reach the surface of the semiconductor layer of the thin film transistor is formed. As such, since the contact hole is formed in the interlayer insulating film, a wall portion of the interlayer insulating film that defines the contact hole is formed.

The contact hole has the first hole formed in the interlayer insulating film and the plurality of second holes formed in the bottom of the first hole. The first hole of the contact hole extends in the longitudinal direction along a direction of a channel width of the thin film transistor on the semiconductor layer and has a rectangular shape as viewed from the substrate surface in plan view. The first hole is not limited to the rectangular shape as viewed from the substrate surface in plan view, that is, the shape linearly extending in the longitudinal direction. For example, the first hole may be formed in a curved shape that has a first portion extending in the direction of the channel width of the thin film transistor and a second portion being curved to the linear portion. Further, a plurality of contact holes may be formed along the direction of the channel width of the thin film transistor.

Further, the plurality of second holes of the contact hole pass through the interlayer insulating film from the bottom of the first hole to reach the semiconductor layer. Further, the plurality of second holes are arranged along the longitudinal direction of the first hole as viewed from the substrate surface in plan view.

Then, in the contact hole, for example, the wiring line is continuously formed from the surface of the interlayer insulating film into the contact hole so as to cover an exposed surface of the semiconductor layer in the contact hole. In this case, a stack contact may be formed with a part of the wiring line formed in the contact hole. A source or a drain of the thin film transistor is electrically connected to the wiring line via the stack contact. Here, one of the source and the drain of the thin film transistor is connected to the wiring line via the stack contact according to the first aspect of the invention. Alternatively, both the source and the drain of the thin film transistor may be connected to the wiring line via the stack contact according to the first aspect of the invention.

As described above, when the stack contact is formed with the part of the wiring line, in the contact hole, the part of the wiring line is formed so as to cover a side wall portion and the bottom of the first hole and is continuously formed from the bottom of the first hole into the plurality of second holes. In the related art described above, with paying attention to the part of the wiring line that forms two adjacent stack contacts, the part formed in the second hole of one of the stack contacts is electrically connected to the part formed of the second hole of the other stack contact via other parts formed in the two first holes. On the contrary, in accordance with the configuration of the stack contact of the first aspect of the invention, with paying attention to parts formed in two adjacent second holes in the part of the wiring line that forms the stack contact, the parts are continuously formed from one of the second holes into the other second hole via the bottom of the first hole. Accordingly, in the part of the wiring line that forms the stack contact, the length of the wiring line for connecting the parts formed in two adjacent second holes to each other can be shortened, as compared to the related art. In particular, the pitch between two adjacent second holes can be smaller than that in the related art, and thus the length of the wiring line continuously formed in two adjacent second holes can be drastically shortened, as compared to the related art. Further, the coverage of the wiring line in the stack contact can be enhanced. Accordingly, relative contact resistance between the wiring line and a wall surface of the contact hole in the stack contact can be reduced, as compared to the related art, and thus, relative resistance of the wiring line can also be reduced.

Further, as described above, in the contact hole, the longitudinal direction of the first hole extends along the channel width direction and the plurality of second holes are arranged along the longitudinal direction of the first hole. Thus, the channel width in the thin film transistor can be widened. As a result, mobility of the thin film transistor can be increased.

Therefore, in accordance with the first aspect of the invention, the on current of the thin film transistor can be increased. The inventors have studied and known that, when the stack contact of the first aspect of the invention is used, for example, the on current of the thin film transistor can be increased by 14%.

It is preferable that the wiring line is continuously formed along the longitudinal direction from the surface of the interlayer insulating film into the contact hole so as to cover the exposed surface of the semiconductor layer in the contact hole.

In accordance with this configuration, the stack contact is formed with the part of the wiring line formed in the contact hole. Accordingly, relative contact resistance between the wiring line and a wall surface of the contact hole in the stack contact can be reduced, as compared to the related art. As a result, relative resistance of the wiring line can also be reduced.

When the wiring line is formed from the surface of the interlayer insulating film into the contact hole, a width of the part of the wiring line continuously formed along the longitudinal direction may be smaller than a width of the first hole in the contact hole and may be larger than a width of each of the second holes as viewed from the substrate surface in plan view.

In accordance with this configuration, the following redundant wiring line effects can be achieved. That is, in the part of the wiring line formed in the stack contact, a current path is formed from the part formed in the first hole of the contact hole to the semiconductor layer via the part formed in each of the second holes. In addition, in addition to this current path, a current path is formed from the wall portion of the first hole of the contact hole to the bottom thereof in a part different from the part formed in the second hole from the part of the wiring line. Thus, even when a disconnection failure temporarily occurs in the part formed in some of the plurality of second holes in the pare of the wiring line, the wiring line and the semiconductor layer can be electrically connected to each other in the current path formed in portions excluding the second holes.

It is preferable that the longitudinal direction extends along the direction of the channel width of the semiconductor layer.

In accordance with this configuration, the channel width of the thin film transistor can be widened, and thus the mobility of the thin film transistor can be efficiently increased.

It is preferable that the contact hole is formed near the source or the drain of the thin film transistor.

In accordance with this configuration, when the first hole of the contact hole is formed, for example, an etching process is performed on the interlayer insulating film via a resist having a corresponding opening pattern. As described above, when the plurality of contact holes are formed along the channel width direction, if the distances between the contact holes are not sufficiently ensured, the transfer of a mask for forming an opening pattern may be not normally performed at an exposure step of a film of a resist material to form the resist. However, if the distances of the contact holes are widened, the thin film transistor becomes large, and thus the substrate for a semiconductor device also becomes large.

On the contrary, according to this configuration, one contact hole is formed near the source or the drain of the thin film transistor. Thus, when the contact hole is formed, the above described inconsistency does not occur, and thus it is advantageous to reduce the size of the thin film transistor. Further, as compared to the case in which the wiring line is continuously formed over the plurality of contact holes, the length of the wiring line in the part of the wiring line that forms the stack contact is formed to the minimum. Therefore, relative resistance of the wiring line can be suppressed low.

It is preferable that the interlayer insulating film is formed so as to have two layers or more.

In accordance with this configuration, the interlayer insulating film is formed so as to have two layers or more. Accordingly, in the related art, when the semiconductor layer and the wiring line are electrically connected to each other via the stack contact, the length of the wiring line for electrically connecting the respective stack contacts may be lengthened, and thus resistance of the wiring line may be increased. On the other hand, when the interlayer insulating film is formed so as to have two layers or more, as described above, the wiring line is continuously formed from the surface of the interlayer insulating film into the contact hole so as to cover the exposed surface of the semiconductor layer in the contact hole, thereby forming the stack contact. Then, by electrically connecting the semiconductor layer and the wiring line to each other via the stack contact, an increase in the length of the wiring line can be suppressed and thus the resistance of the wiring line can be suppressed low.

When the interlayer insulating film is formed so as to have two layers or more, a lower interlayer insulating film and an upper interlayer insulating film disposed above the lower interlayer insulating film may be formed such that the interface of the lower interlayer insulating film and the upper interlayer insulating film is disposed higher than the bottom of the first hole in the contact hole.

If doing so, when the first hole is formed by an etching process to form the contact hole, if the upper interlayer insulating film has an etching rate to an etchant lower than the lower interlayer insulating film, the interface of the upper interlayer insulating film and the lower interlayer insulating film is narrowed and thus the coverage of the wiring line in the contact hole may be decreased. Accordingly, the disconnection failure may occur. Further, when the second hole is formed, with only a dry etching method, the semiconductor layer may be removed. Thus, it is preferable to use a wet etching method.

In this case, when the etching process is performed, a part of the side wall of the first hole disposed in the interface of the upper interlayer insulating film and the lower interlayer insulating film is formed by the dry etching method, the part of the side wall is covered with the resist, and the second hole is formed by using the wet etching method. In such a manner, the narrowness can be prevented. As a result, in accordance with this configuration, the disconnection failure of the stack contact can be prevented.

According to a second aspect of the invention, a substrate for a semiconductor device includes a substrate, a lower conductive layer that is provided on the substrate, an upper conductive layer that is provided above the lower conductive layer, an interlayer insulating film that electrically isolates the upper conductive layer from the lower conductive layer, and a contact hole that has a first hole being cut in the interlayer insulating film and extending in a longitudinal direction as viewed from a substrate surface in plan view and a plurality of second holes passing through the interlayer insulating film from a bottom of the first hole to reach a surface of the lower conductive layer and being arranged in the longitudinal direction of the first hole, and that connects the upper conductive layer to the lower conductive layer via the interlayer insulating film.

In accordance with the second aspect of the invention, in the contact hole, for example, the upper conductive layer is continuously formed from a surface of the interlayer insulating film into the contact hole so as to cover an exposed surface of the lower conductive layer in the contact hole. As such, a stack contact is formed with a part of the upper conductive layer formed in the contact hole.

Thus, in the stack contact, the coverage of the upper conductive layer can be enhanced. Further, relative contact resistance of the upper conductive layer in the contact hole can be reduced, as compared to the related art. As a result, relative resistance of the upper conductive layer can be reduced.

It is preferable that the upper conductive layer is continuously formed in the longitudinal direction from the surface of the interlayer insulating film into the contact hole so as to cover the exposed surface of the lower conductive layer in the contact hole.

In accordance with this configuration, the stack contact is formed with the part of the upper conductive layer formed in the contact hole. Thus, in the stack contact, the coverage of the upper conductive layer can be enhanced. Further, the relative contact resistance of the upper conductive layer in the stack contact can be reduced, as compared to the related art.

According to a third aspect of the invention, there is provided a substrate for an electro-optical device that includes the above-described substrate for a semiconductor device according to the first or second aspect of the invention (including various configurations described above). The substrate for an electro-optical device includes a plurality of pixel portions that are formed in an image display region on the substrate, thin film transistors, wiring lines, and driving circuits that drive the plurality of pixel portions.

In accordance with the third aspect of the invention, each of the pixel portions has a liquid crystal element serving as a display element. Further, the respective pixel portions are driven by the driving circuits, and thus images can be displayed by the display elements.

In a case where each pixel portion has a liquid crystal element, for example, an alignment film may be formed so as to extend from the image display region to the peripheral region. In this case, the alignment film is formed on the interlayer insulating film that is formed on the wiring line so as to electrically isolate the wiring line. Here, on the surface of the interlayer insulating film formed on the part of the wiring line formed in the stack contact according to the third aspect of the invention, an uneven shape may be formed so as to correspond to a surface shape of the part of the wiring line. Then, the surface shape of the interlayer insulating film is reflected as the surface shape of the alignment film formed on the interlayer insulating film.

In accordance with this configuration, an unevenly stepped shape formed on the interlayer insulating film formed on the part of the wiring line can be planarized. Thus, the surface of the alignment film formed on the interlayer insulating film can be relatively planarized. Here, when a rubbing process is performed, if the step generated in the surface of the alignment film is large, the surface of the alignment film may be damaged, the film may be removed. In accordance with this configuration, display irregularity can be prevented from occurring due to the removal of the alignment film or damage in the rubbing process. Further, a display failure can be prevented from a decrease in the on current of the thin film transistor in the driving circuit.

According to a fourth aspect of the invention, an electro-optical device includes the substrate for an electro-optical device of the third aspect of the invention, a counter substrate that faces the substrate for an electro-optical device, and an electro-optical material that is disposed between the substrate for an electro-optical device and the counter substrate.

In accordance with the fourth aspect of the invention, the electro-optical device has the above-described substrate for an electro-optical device, the display failure, such as display irregularity or the like, can be prevented from occurring, and thus a high-quality image display can be achieved. Moreover, in each of the pixel portions, when the display element is the liquid crystal element, the liquid crystal element has liquid crystal that is interposed between pixel electrodes formed on the substrate for an electro-optical device and a counter electrode formed on the counter substrate.

According to a fifth aspect of the invention, there is provided an electronic apparatus that includes the electro-optical device of the fourth aspect of the invention.

The electronic apparatus of the fifth aspect of the invention has the electro-optical device of the fourth aspect of the invention. Thus, various electronic apparatuses, which can perform a high-quality image display, such as a projection-type display device, a television, a cellular phone, an electronic organizer, a word processor, a view finder-type or monitor-direct-view-type video tape recorder, a work station, a video phone, a POS terminal, a touch panel, and the like, can be implemented. Further, the electronic apparatus of the fifth aspect of the invention can include an electrophoretic device, such as an electronic paper, an electron emission device (a field emission display or conduction electron-emitter display), or a digital light processing (DLP) as an apparatus using the electrophoretic device or the electron emission device.

According to a sixth aspect of the invention, a method of manufacturing a substrate for a semiconductor device includes, on a substrate, forming a thin film transistor, forming a wiring line above the thin film transistor, forming an interlayer insulating film that electrically isolates the wiring line from at least a semiconductor layer of the thin film transistor, and forming, in the interlayer insulating film, a first hole that extends in a longitudinal direction as viewed from a substrate surface in plan view and forming a plurality of second holes that pass through the interlayer insulating film from a bottom of the first hole to reach a surface of the semiconductor layer and that are arranged in the longitudinal direction of the first hole, so as to form a contact hole that connects the wiring line to the semiconductor layer via the interlayer insulating film.

In accordance with the sixth aspect of the invention, after the first hole is formed, the plurality of second holes are formed, thereby forming the contact hole. Here, the first hole is formed so as to surround the plurality of second holes as viewed from the substrate surface in plan view and thus the first hole has a relatively large size. The first hole is formed, for example, by performing an etching process on the interlayer insulating film with a resist having an opening pattern. At this time, it is preferable to form the first hole by a dry etching method so as to prevent the resist film from being removed.

If only the dry etching method is used so as to form the plurality of second holes, the semiconductor layer may be removed. Thus, it is preferable to form the plurality of second holes by a wet etching method. When the interlayer insulating film has two layers or more, an upper interlayer insulating film has an etching rate to an etchant lower than a lower interlayer insulating film, as described above, the interface of the upper interlayer insulating film and the lower interlayer insulating film may be narrowed when the second holes are formed by the wet etching method.

Thus, a depth of the first hole is adjusted, such that a part disposed in the interface of the upper interlayer insulating film and the lower interlayer insulating film in a side wall of the first hole is formed by the dry etching method. Further, after the side wall portion of the first hole is covered with a resist or the like, the plurality of second holes are formed. Then, for example, the wiring line is continuously formed from the surface of the interlayer insulating film into the contact hole to form the stack contact, and thus a disconnection failure in the part of the wiring line formed in the contact hole can be reliably prevented from occurring. Moreover, an entire portion of the side wall of the first hole disposed in the interface of the upper interlayer insulating film and the lower interlayer insulating film may be formed by the dry etching method. Alternatively, a part of the first hole disposed in the interface of the upper interlayer insulating film and the lower interlayer insulating film may be formed by the dry etching method.

Therefore, in accordance with the sixth aspect of the invention, in manufacturing the substrate for a semiconductor device, the yield can be enhanced.

It is preferable that, in the forming of the contact hole, the first hole is formed by the dry etching method.

In accordance with this configuration, in the forming of the contact hole, when the first hole is formed by performing the etching process on the interlayer insulating film with the resist, the resist can be prevented from being removed.

It is preferable that, in the forming of the contact hole, the second hole is formed by a wet etching method, in addition to the dry etching method.

In accordance with this configuration, after forming a small hole from the bottom of the first hole into the interlayer insulating film by the dry etching method, the small hole is further cut by the wet etching method so as to pass through the interlayer insulating film, thereby forming the second hole. Thus, in accordance with this configuration, the semiconductor layer can be prevented from being removed or cut when the second hole is formed.

It is preferable that, in the forming of the interlayer insulating film, the interlayer insulating film is formed so as to have two layers or more. Further, in the forming of the contact hole, the lower interlayer insulating film and the upper interlayer insulating film disposed above the lower interlayer insulating film may be subjected to the etching process, such that the first hole is formed so as to pass through the upper interlayer insulating film into the lower interlayer insulating film. At this time, the part of the side wall disposed in the interface of the upper interlayer insulating film and the lower interlayer insulating film in the first hole is formed by the dry etching method.

In accordance with this configuration, a disconnection failure can be reliably prevented from occurring in the part of the wiring line formed in the contact hole.

According to a seventh aspect of the invention, a method of manufacturing a substrate for a semiconductor device includes, on a substrate, forming a thin film transistor, forming a wiring line above the thin film transistor, forming an interlayer insulating film that electrically isolates the wiring line from at least a semiconductor layer of the thin film transistor, forming a plurality of small holes, forming, in the interlayer insulating film, a first hole that extends in a longitudinal direction as viewed from a substrate surface in plan view so as to overlap the plurality of small holes and to surround the plurality of small holes as viewed from the substrate in plan view, and further cutting the plurality of small holes so as to form a plurality of second holes that pass through the interlayer insulating film from a bottom of the first hole to reach a surface of the semiconductor layer and that are arranged in the longitudinal direction of the first hole, and to form a contact hole that connects the wiring line to the semiconductor layer via the interlayer insulating film.

In accordance with the seventh aspect of the invention, in the forming of the contact hole, after the plurality of small holes are formed, the first hole is formed so as to overlap the plurality of small holes and to surround the plurality of small holes as viewed from the substrate surface in plan view. At this time, the plurality of small holes are formed by performing both or one of a wet etching method and a dry etching method on the interlayer insulating film with a resist having a corresponding opening pattern.

Further, the first hole is formed by performing an etching process on the interlayer insulating film with the same resist as that in the plurality of small holes. At this time, in order to prevent the resist from being removed, the first hole is preferably formed by the dry etching method. When the first hole is formed, the plurality of small holes are further cut, and thus the plurality of second holes are formed.

Therefore, in accordance with the seventh aspect of the invention, the yield can be enhanced in manufacturing the substrate for a semiconductor device.

It is preferable that, in the forming of the wiring line, the wiring line is continuously formed in the longitudinal direction from a surface of the interlayer insulating film into the contact hole so as to cover an exposed surface of the semiconductor layer in the contact hole.

In accordance with this configuration, a disconnection failure can be prevented from occurring in the part of the wiring line formed in the contact hole.

The effects and advantages of the invention will be apparent from embodiments described below.

BRIEF DESCRIPTION OF THE DRAWINGS

The invention will be described with reference to the accompanying drawings, wherein like numbers reference like elements, and wherein.

DESCRIPTION OF THE EMBODIMENTS

Hereinafter, an embodiment of the invention will be described with reference to the drawings. In the embodiment described below, an electro-optical device of the invention is applied to a liquid crystal device.

1: Overall Configuration of Electro-Optical Device

Figure 1:
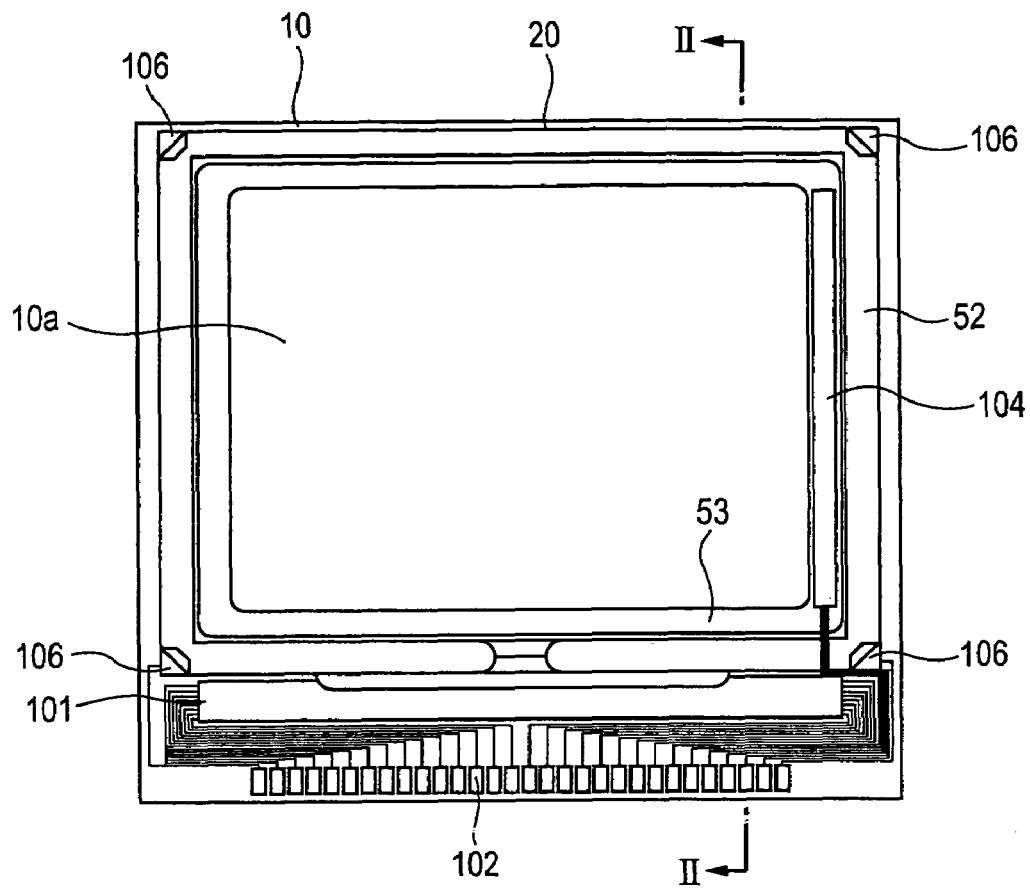
FIG. 1 is a plan view showing an overall configuration of an electro-optical device according to an embodiment of the invention.
Figure 2:
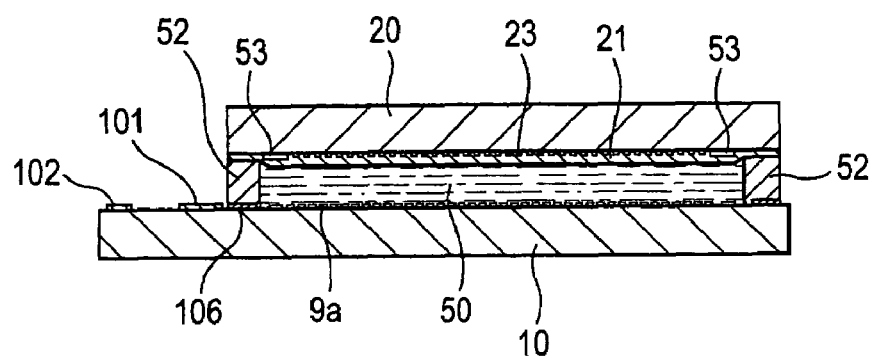
FIG. 2 is a cross-sectional view taken along the line II-II of FIG. 1.
Figure 3:
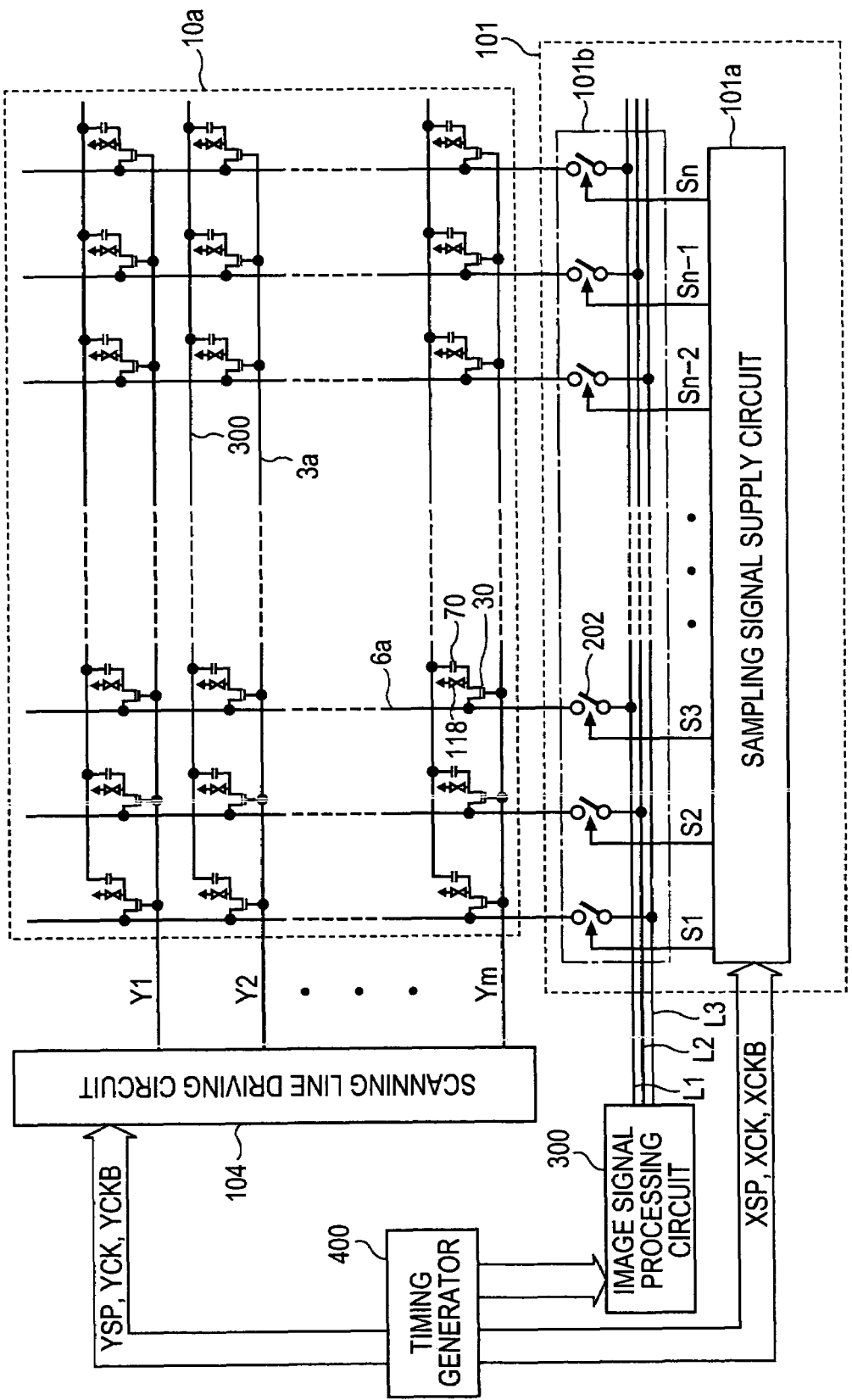
FIG. 3 is a block diagram showing an electrical configuration of an electro-optical device.

First, the overall configuration of an electro-optical device of the invention will be described with reference to FIGS. 1 to 3. FIG. 1 is a plan view of an electro-optical device as viewed from a counter substrate, together with a TFT array substrate and respective constituents formed thereon. FIG. 2 is a cross-sectional view taken along the line II-II of FIG. 1. Further, FIG. 3 is a block diagram showing an electrical configuration of an electro-optical device. Here, as an example of an electro-optical device, a TFT active matrix driving-type liquid crystal device having built-in driving circuits is used.

Referring to FIGS. 1 and 2, in the electro-optical device according to the present embodiment, a TFT array substrate 10 and a counter substrate 20 are arranged to face each other. Between the TFT array substrate 10 and the counter substrate 20, a liquid crystal layer 50 is sealed. The TFT array substrate 10 and the counter substrate 20 are bonded to each other by a sealing member 52 which is provided in a sealing region disposed in the periphery of an image display region 10a.

The sealing member 52 is made of, for example, ultraviolet curable resin, thermosetting resin, or the like, so as to bond both substrates. In a manufacturing process, the sealing member 52 is coated on the TFT array substrate 10 and is hardened by ultraviolet irradiation, heating, or the like. Further, gap members, such as glass fibers or glass beads, are distributed in the sealing member 52 so as to maintain the space between the TFT array substrate 10 and the counter substrate 20 (a gap between the substrates) at a predetermined value. That is, the electro-optical device of the present embodiment having a small size is suitable for a light valve of a projector so as to display an image at a magnified scale.

Inside the sealing region in which the sealing member 52 is arranged, a frame-shaped light-shielding film 53 which defines a frame region of the image display region 10a is provided on the counter substrate 20. In this case, the frame-shaped light-shielding film 53 may be partially or entirely formed as a built-in light-shielding film of the TFT array substrate 10. Moreover, in the present embodiment, there exists a peripheral region which is disposed in the periphery of the image display region 10a. Specifically, in the present embodiment, in particular, a region outside the frame-shaped light-shielding film 53 is defined as the peripheral region, as viewed from the center of the TFT array substrate 10.

In a region disposed outside the sealing region, in which the sealing member 52 is arranged, from the peripheral region disposed in the periphery of the image display region 10a, a date line driving circuit 101 and external circuit connecting terminals 102 are provided along one side of the TFT array substrate 10. Further, a scanning line driving circuit 104 is provided along any one of two sides adjacent to the one side so as to be covered with the frame-shaped light-shielding film 53. Moreover, scanning line driving circuits 104 may be provided along two sides adjacent to the one side of the TFT array substrate 10, on which the data line driving circuit 101 and the external circuit connecting terminals 102 are provided. In this case, the two scanning line driving circuits 104 are connected to each other via a plurality of wiring lines which are provided along the last side of the TFT array substrate 10.

Further, at four corner portions of the counter substrate 20, vertical connecting members 106 are arranged so as to function as vertical connecting members between both substrates. On the other hand, on the TFT array substrate 10, vertical connecting members are provided in regions corresponding to the corner portions. In such a manner, the TFT array substrate 10 and the counter substrate 20 can be electrically connected to each other.

In FIG. 2, on the TFT array substrate 10, an alignment film is formed on pixel electrodes 9a after pixel switching TFTs or wiring lines, such as data lines, scanning lines and the like, are formed. On the other hand, on the counter substrate 20, in addition to a counter electrode 21, a lattice or stripe-shaped light-shielding film 23 and an alignment film as an uppermost layer are formed. Further, the liquid crystal layer 50 is made of liquid crystal into which one or several types of nematic liquid crystal are mixed and has a predetermined alignment state between the pair of alignment films.

Moreover, though not shown in FIGS. 1 and 2, on the TFT array substrate 10, in addition to the data line driving circuit 101 or the scanning line driving circuit 104, a precharge circuit that supplies a precharge signal having a predetermined voltage level to a plurality of data lines prior to image signals and a test circuit that tests for defects, the quality, and the like of the electro-optical device during manufacturing and at the time of shipping may be formed.

Next, an electrical configuration of the above-described electro-optical device will be described with reference to FIG. 3.

As shown in FIG. 3, in the electro-optical device, an image signal processing circuit 300 and a timing generator 400 are provided as external circuits. The timing generator 400 is constructed to output various timing signals which are used in the respective parts. With a timing signal output unit which is a part of the timing generator 400, a dot clock, which is a minimum unit clock, is created to scan respective pixels. Then, based on the dot clock, a Y clock signal YCK, an inverted Y clock signal YCKB, an X clock signal XCK, an inverted clock signal XCKB, a Y start pulse YSP, and an X start pulse XSP are generated.

When color display is performed in the image display region 10a, if input image data is inputted from the outside, the image signal processing circuit 300 generates image signals of an R signal, a G signal, and a B signal corresponding to red (R), green (G), and blue (B), respectively. Moreover, though simplified in FIG. 3, for example, input image data may be converted into a plurality of image signals through the serial-parallel conversion to be outputted. The R signal, the G signal, and the B signal outputted from the image signal processing circuit 300 are sequentially supplied from the image signal processing circuit 300 to the data line driving circuit 101 via image signal supply lines L1, L2, and L3.

The Y clock signal YCK, the inverted Y clock signal YCKB, and the Y start pulse YSP are supplied to the scanning line driving circuit 104. If the Y start pulse YSP is inputted, the scanning line driving circuit 104 sequentially generates and outputs scanning signals Y1, Y2, . . . , Ym at the timing based on the Y clock signal YCK and the inverted Y clock signal YCKB.

As a main part of the data line driving circuit 101, a sampling signal supply circuit 101a and a sampling circuit 101b are included. If the X start pulse XSP is inputted, the sampling signal supply circuit 101a sequentially generates and outputs sampling signals S1, . . . , Sn at the timing based on the X clock signal XCK and the inverted X clock signal XCKB. The sampling circuit 101b has a plurality of sampling switches 202 which are formed with a single-channel TFT of a P-channel-type or an N-channel-type or a complementary TFT.

In the image display region 10a occupying the center of the TFT array substrate 10, data lines 6a and scanning lines 3a are wired horizontally and vertically. Further, at respective pixel portions corresponding to the intersections of the data lines 6a and the scanning lines 3a, the pixel electrodes 9a of liquid crystal elements 118 arranged in a matrix shape and TFTs 30, as pixel switching elements, that control switching of the pixel electrodes 9a are provided. Moreover, in the present embodiment, in particular, the total number of scanning lines 3a is m (where m is a natural number of 2 or more) and the total number of data lines 6a is n (where n is a natural number of 2 or more).

The plurality of data lines 6a arranged in the image display region 10a are provided with respect to three types of signal, that is, R, G, and B. Further, in the sampling circuit 101b, the sampling switches 202 are respectively provided for the data lines 6a. Each of the sampling switches 202 samples and supplies any one of the R signal, the G signal, and the B signal to the corresponding data line 6a according to the sampling signal Si (where i=1, 2, . . . , n) outputted from the sampling signal supply circuit 101a.

Figure 4:
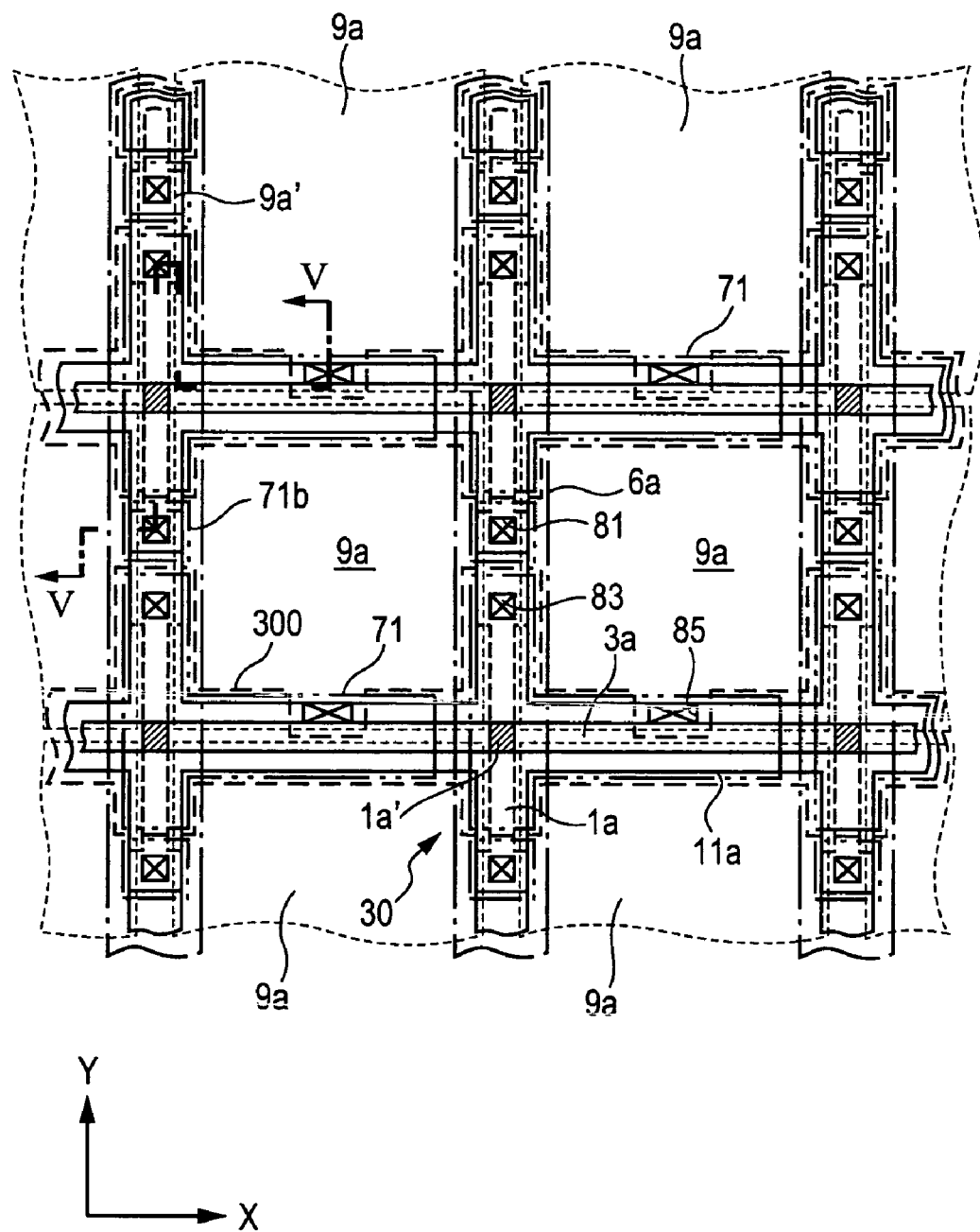
FIG. 4 is a plan view of a plurality of adjacent pixel groups in a TFT array substrate on which data lines, scanning lines, pixel electrodes, and the like are formed.

In FIG. 4, paying attention to the configuration of one pixel portion, a source electrode of the TFT 30 is electrically connected to the data line 6a to which one of the R signal, the G signal, and the B signal is supplied. A gate electrode of the TFT 30 is electrically connected to the scanning line 3a to which the scanning signal Yj (where j=1, 2, . . . , m) is supplied. A drain electrode of the TFT 30 is connected to the pixel electrode 9a of the liquid crystal element 118. Here, in each pixel portion, the liquid crystal element 118 has the pixel electrode 9a and the counter electrode 21 with liquid crystal interposed therebetween. Thus, the respective pixel portions are arranged in a matrix shape to correspond to the intersections of the scanning lines 3a and the data lines 6a.

The pixel electrode 9a of the liquid crystal element 118 is supplied with the image signal from the data line 6a at a predetermined timing when the TFT 30 is turned on for a constant time. Accordingly, a voltage according to potentials on the pixel electrode 9a and the counter electrode 21 is applied to the liquid crystal element 118. Liquid crystal changes the alignment or order of the molecular groups according to the level of voltage applied to provide light modulation and a grayscale display. In a normally white mode, transmittance of the incident light is decreased according to the voltage applied to each pixel. In a normally black mode, transmittance of the incident light is increased according to the voltage applied to each pixel. As a result, light having a contrast according to the image signal is emitted from the liquid crystal panel 100 as a whole.

Here, in order to prevent leakage of the held image signal, a storage capacitor 70 is added in parallel with the liquid crystal element 118. For example, the voltage of the pixel electrode 9a is held by the storage capacitor 70 for a longer time, namely, for a period as much as three orders of magnitude longer than the time for which the source voltage is applied. Accordingly, the maintenance characteristic is enhanced, such that a high contrast ratio can be realized.

2: Configuration of Pixel Portion

Hereinafter, the configuration in a pixel portion of an electro-optical device of the present embodiment of the invention will be described with reference to FIGS. 4 to 8.

Figure 5:
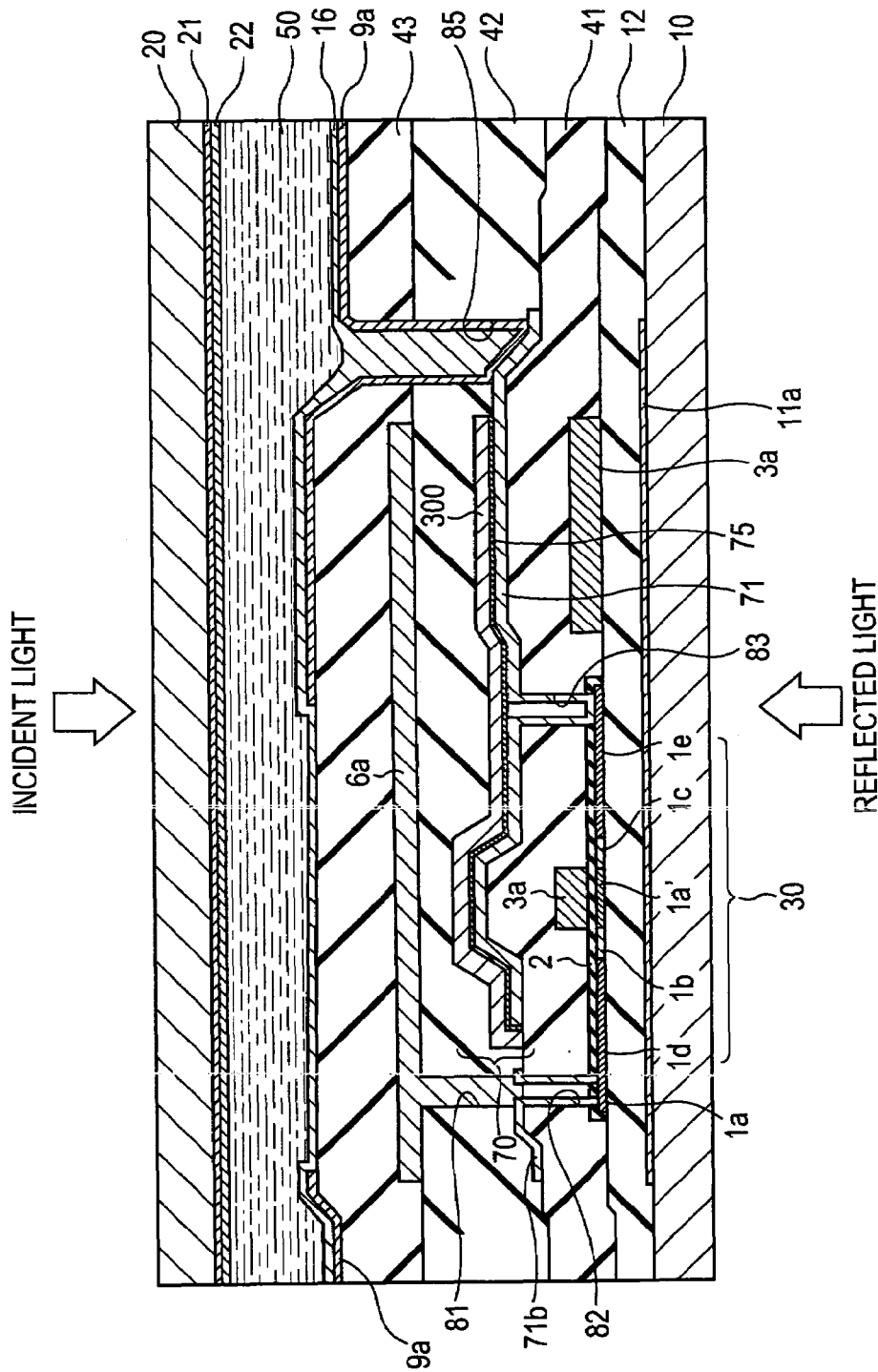
FIG. 5 is a cross-sectional view taken along the line V-V of FIG. 4.

FIG. 4 is a plan view of a plurality of adjacent pixel groups in a TFT array substrate on which the data lines, the scanning lines, the pixel electrodes, and the like are formed. FIG. 5 is a cross-sectional view taken along the line V-V of FIG. 4. Moreover, in FIG. 5, the scale of each layer or member has been adjusted in order to have a recognizable size.

In FIG. 4, the plurality of transparent pixel electrodes 9a (respectively, indicated by a dotted line area 9a') are provided in a matrix shape on the TFT array substrate 10 of the electro-optical device. The data lines 6a and the scanning lines 3a are respectively provided along the horizontal and vertical boundaries of the pixel electrodes 9a.

Further, the scanning line 3a is arranged to face a channel region 1a' (region indicated by upward hatched lines in FIG. 4) in a semiconductor layer 1a. The scanning line 3a includes a gate electrode. As such, the pixel switching TFTs 30 in which the part of the scanning lines 3a are arranged to face the channel regions 1a' to serve as the gate electrodes are provided at the intersections of the scanning lines 3a and the data line 6a.

Figure 6:
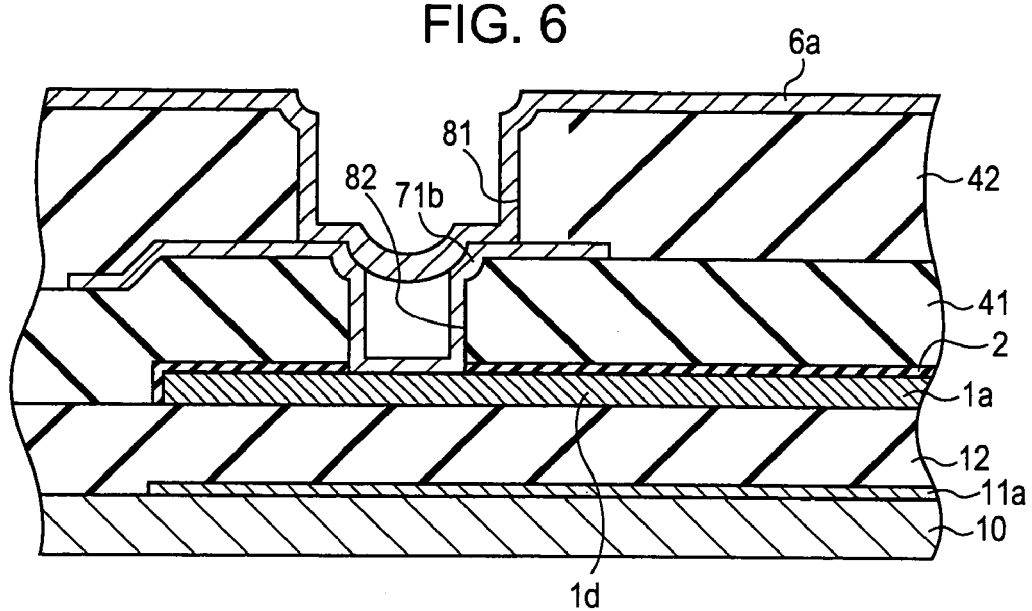
FIG. 6 is a cross-sectional view showing a configuration of a connection between a data line and a semiconductor layer of a TFT.

Here, FIG. 6 is a cross-sectional view showing the configuration of the connection of the data line 6a and the semiconductor layer 1a of the TFT 30 shown in FIG. 5 in more detail. As shown in FIGS. 5 and 6, the data line 6a is formed with a second interlayer insulating film 42 having a planarized upper surface as a base. A part of the data line 6a formed in a contact hole 81 that passes through the second interlayer insulating film 42 is connected to a heavily-doped source region 1d of the TFT 30 via a relay layer 71b which is continuously formed from a contact hole 82 passing through a first interlayer insulating film 41 to the surface of the first interlayer insulating film 41. In the present embodiment, the data line 6a is made of a material containing aluminum (Al) or an elemental metal of aluminum (Al). Further, the relay layer 71b is preferably made of a conductive polysilicon film.

Further, in FIG. 5, the storage capacitor 70 is configured such that a lower capacitor electrode 71 connected to a heavily-doped drain region 1e of the TFT 30 and the pixel electrode 9a to serve as a pixel-potential-side capacitor electrode and a part of an upper capacitor electrode 300 to serve as a fixed-potential-side capacitor electrode are arranged to face each other with a dielectric film 75 interposed therebetween.

As shown in FIGS. 4 and 5, the upper capacitor electrode 300 is made of, for example, a conductive light-shielding film containing a metal or an alloy and is provided above the TFT 30 as an example of an upper light-shielding film (a built-in light-shielding film). Further, the upper capacitor electrode 300 serves as the fixed-potential-side capacitor electrode. The upper capacitor electrode 300 is made of, for example, an elemental metal, an alloy, a metal silicide, a polysilicide, or a laminate of these materials, including at least one high-melting-point metal, such as titanium (Ti), chromium (Cr), tungsten (W), tantalum (Ta), molybdenum (Mo), palladium (Pd), and the like. The upper capacitor electrode 300 may include other metals such as aluminum (Al), silver (Ag), or the like. Alternatively, the upper capacitor electrode 300 may have a multilayer structure including, for example, a laminate of a first layer made of a conductive polysilicon film and a second layer made of a metal silicide film including a high-melting-point metal.

On the other hand, the lower capacitor electrode 71 is made of, for example, a conductive polysilicon film and serves as the pixel-potential-side capacitor electrode. The lower capacitor electrode 71 serves as the pixel-potential-side capacitor electrode, and also as a light-absorbing layer or an additional upper light-shielding layer which is arranged between the upper capacitor electrode 300 serving as the upper light-shielding film and the TFT 30. In addition, the lower capacitor electrode 71 serves as the relay layer that connects the pixel electrode 9a to the heavily-doped drain region 1e of the TFT 30. Like the upper capacitor electrode 300, the lower capacitor electrode 71 may be made of a single-layer film or a multilayer film.

The dielectric film 75 disposed between the lower capacitor electrode 71 and the upper capacitor electrode 300 serving as the capacitor electrodes is made of, for example, a silicon oxide film, such as a high temperature oxide (HTO) film, a low temperature oxide (LTO) film, or the like, or a silicon nitride film. In view of an increase of the storage capacitor 70, the dielectric film 75 is preferably thinned, as long as sufficient reliability of the film is obtained.

Further, the upper capacitor electrodes 300 are provided to extend from the image display region 10a, in which the pixel electrodes 9a are arranged, to a periphery thereof and are electrically connected to a constant potential source to have a fixed potential. The constant potential source may be a positive or negative constant potential source to be supplied to the scanning line driving circuit 104 or the data line driving circuit 101 or may be a constant potential source to be supplied to the counter electrode 21 of the counter substrate 20.

On the other hand, below the TFTs 30, a lower light-shielding film 11a is provided in a lattice shape, with a base insulating film 12 therebetween.

The lower light-shielding film 11a is provided to shield the channel region 1a' of the TFT 30 and a periphery thereof from reflected light which is incident from the TFT array substrate 10 into the device. Like the upper capacitor electrode 300, which is an example of the upper light-shielding film, the lower light-shielding film 11a is made of, for example, an elemental metal, an alloy, a metal silicide, a polysilicide, or a laminate of these materials, including at least one high-melting-point metal, such as titanium (Ti), chromium (Cr), tungsten (W), tantalum (Ta), molybdenum (Mo), palladium (Pd), and the like. In addition, in order to prevent an adverse effect of a change in potential on the TFT 30, the lower light-shielding film 11a may be connected to a constant potential source to extend from the image display region to the periphery thereof, like the upper capacitor electrode 300.

The base insulating film 12 electrically isolates the TFT 30 from the lower light-shielding film 11a, and also is provided on the entire surface of the TFT array substrate 10 to prevent a deterioration in characteristics of the pixel switching TFT 30 due to roughness at the time of polishing the surface of the TFT array substrate 10 or remnants after cleaning.

The pixel electrode 9a is electrically connected to the heavily-doped drain region 1e in the semiconductor layer 1a via contact holes 83 and 85 with the lower capacitor electrode 71 as the relay layer.

As shown in FIGS. 4 and 5, the electro-optical device has the transparent TFT array substrate 10 and the transparent counter substrate 20 that is disposed to face the TFT array substrate 10. The TFT array substrate 10 is made of, for example, a quartz substrate, a glass substrate, or a silicon substrate, and the counter substrate 20 is made of, for example, a glass substrate or a quartz substrate.

On the TFT array substrate 10, the pixel electrodes 9a are provided, and an alignment film 16, on which a predetermined alignment process such as a rubbing process is performed, is provided on the pixel electrodes 9a. The pixel electrodes 9a are made of, for example, a transparent conductive film such as an indium tin oxide (ITO) film or the like. Further, the alignment film 16 is made of, for example, an organic film such as a polyimide film.

On the other hand, on the counter substrate 20, the counter electrode 21 is provided over the entire surface. An alignment film 22, on which a predetermined alignment process such as a rubbing process is performed, is provided under the counter electrode 21. The counter electrode 21 is made of, for example, a transparent conductive film, such as an ITO film. Further, the alignment film 22 is made of an organic film such as a polyimide film.

On the counter substrate 20, a lattice-shaped or stripe-shaped light-shielding film may be provided. In this case, together with the upper light-shielding film provided as the upper capacitor electrode 300, light from the TFT array substrate 10 can be prevented from being incident on the channel region 1a' and the periphery thereof more reliably. Moreover, at least the surface of the light-shielding film on the counter substrate 20 is formed to have high reflectance for external light, such that an increase in the temperature of the electro-optical device can be prevented.

Between the TFT array substrate 10 and the counter substrate 20 configured in such a manner and disposed such that the pixel electrodes 9a and the counter electrode 21 face each other, the liquid crystal layer 50 is formed. The liquid crystal layer 50 is given a predetermined alignment state by the alignment films 16 and 22 when an electric field is not applied from the pixel electrodes 9a thereto.

Referring to FIG. 5, the pixel switching TFT 30 has a lightly doped drain (LDD) structure, which has the scanning line 3a, the channel region 1a' of the semiconductor layer 1a in which a channel is formed by an electric field from the scanning line 3a, an insulating film 2 that includes a gate insulating film for electrically isolating the semiconductor layer 1a from the scanning line 3a, a lightly-doped source region 1b and a lightly-doped drain region 1c in the semiconductor layer 1a, and the heavily-doped source region 1d and the heavily-doped drain region 1e in the semiconductor layer 1a.

On the scanning line 3a, the first interlayer insulating film 41, through which the contact hole 82 extends to the heavily-doped source region 1d and the contact hole 83 extends to the heavily-doped drain region 1e, is formed.

On the first interlayer insulating film 41, the lower capacitor electrode 71 and the upper capacitor electrode 300 are formed. On the first interlayer insulating film 41, the lower capacitor electrode 71, and the upper capacitor electrode 300, the second interlayer insulating film 42, through which the contact holes 81 and 85 extend, is formed.

On the second interlayer insulating film 42, the data line 6a is formed. On the second interlayer insulating film 42 and the data line 6a, a third interlayer insulating film 43, through which the contact hole 85 extend to the lower capacitor electrode 71, is formed. The pixel electrode 9a is provided on the upper surface of the third interlayer insulating film 43 formed in such a manner.

Moreover, as shown in FIGS. 4 and 5, steps occurring in various members, such as the storage capacitor 70, the scanning line 3a, the TFT 30, and the like, underlying the second interlayer insulating film 42 are removed by performing a planarization process on the surface of the second interlayer insulating film 42. For example, the planarization is performed by a polishing process such as a chemical mechanical polishing (CMP) process or an organic spin on glass (SOG) process. Instead of or in addition to the planarization process on the second interlayer insulating film 42, a planarization process may be performed by forming a groove in at least one of the TFT array substrate 10, the base insulating film 12, and the first interlayer insulating film 41 and by burying the storage capacitor 70, the scanning line 3a, the TFT 30, and the like.

3: Configuration in Peripheral Region

As described above, the configuration in the pixel portion is common to all pixel portions, as shown in FIG. 4. In the image display region 10a described with reference to FIGS.

1 and 2, such a configuration in the pixel portion is repeatedly formed. On the other hand, in such an electro-optical device, in the peripheral region disposed in the periphery of the image display region 10a, as described with reference to FIGS. 1 to 3, the scanning line driving circuit 104 or the data line driving circuit 101 is formed. Then, the scanning line driving circuit 104 or the data line driving circuit 101 has, for example, TFTs as a plurality of switching elements, wiring lines, and the like.

Figure 7:
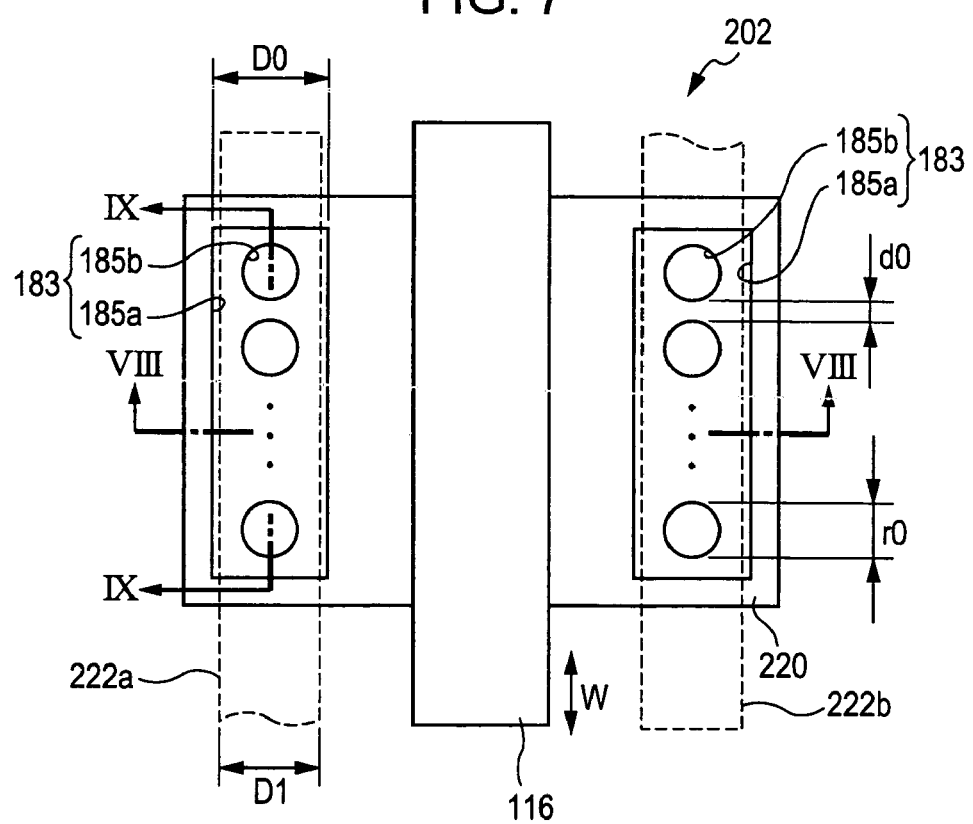
FIG. 7 is a plan view showing a configuration of a TFT which is an example of a switching element formed in a peripheral region.
Figure 8:
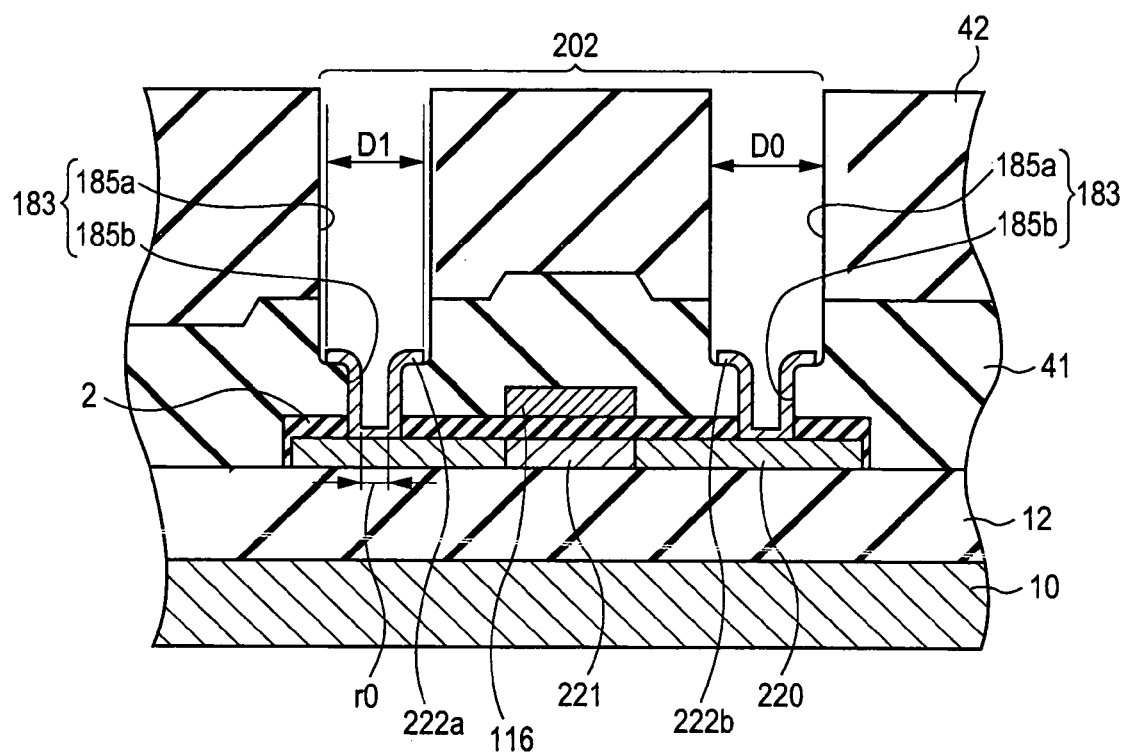
FIG. 8 is a cross-sectional view taken along the line VIII-VIII of FIG. 7.
Figure 9:
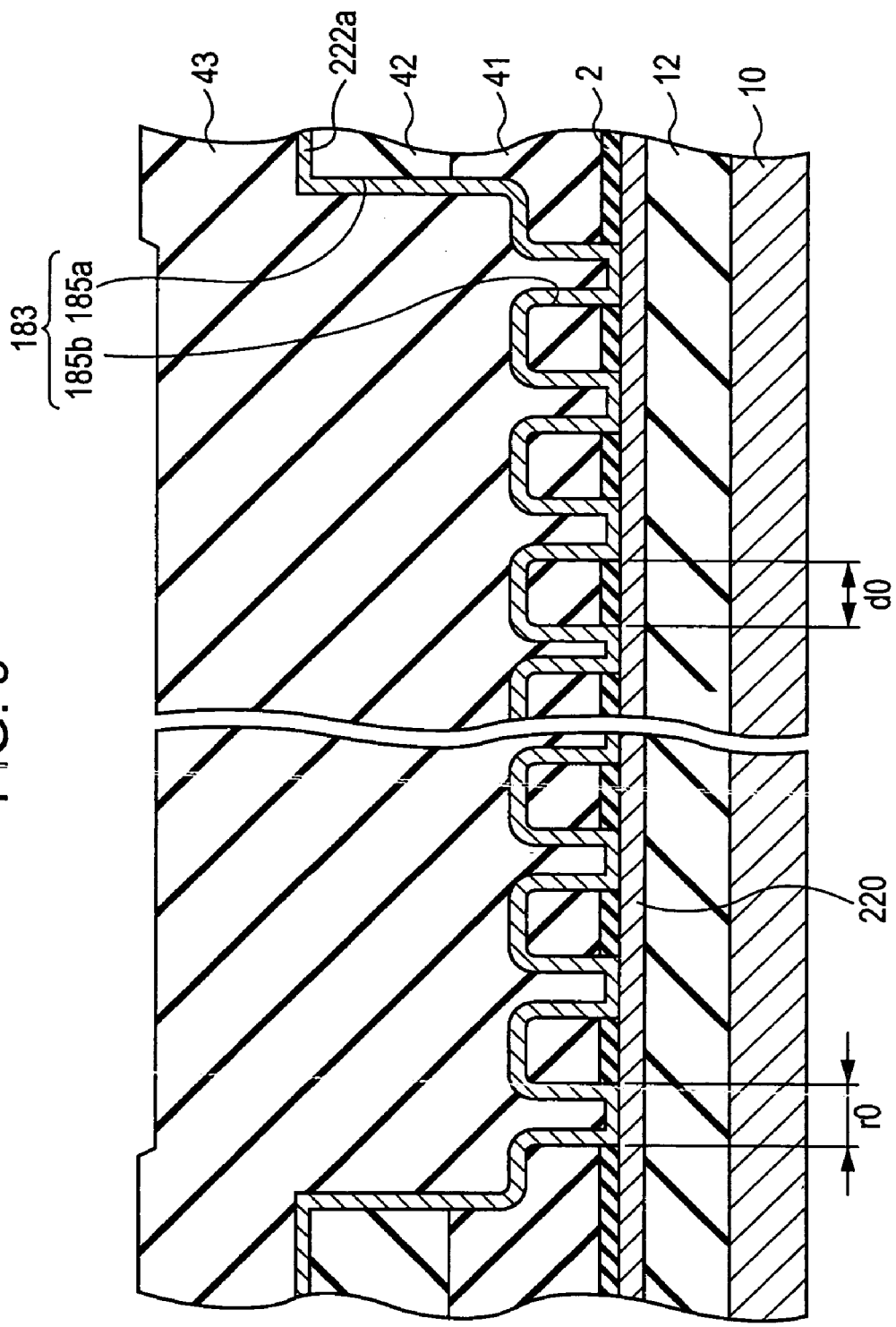
FIG. 9 is a cross-sectional view taken along the line IX-IX of FIG. 7.

FIG. 7 is a schematic plan view showing a configuration of a single-channel-type TFT, which is an example of a switching element formed on the peripheral region. FIG. 8 is a cross-sectional view taken along the line VIII-VIII of FIG. 7. FIG. 9 is a cross-sectional view taken along the line IX-IX of FIG. 7.

Hereinafter, a configuration of the sampling switch 202 shown in FIG. 3, which is an example of a configuration of a circuit element or a wiring line, in the scanning line driving circuit 104 or the data line driving circuit 101 provided in the peripheral region, will be described with reference to FIGS. 7 to 9. The sampling switch 202 is formed with a single-channel-type TFT.

As shown in FIGS. 7 and 8, the TFT 202 serving as the sampling switch has a semiconductor layer 220, a gate insulating film 2, and a gate electrode film 116. Various wiring lines 222a and 222b are also formed so as to be connected to a drain and a source of the semiconductor layer 220. Then, in FIG. 8 or 9, as seen from reference numerals 12, 41, 42, 43, and the like, the TFT 202 and a superstructure thereof are formed simultaneously with the configuration in the pixel portion shown in FIG. 5. That is, it is configured such that, for example, the semiconductor layer 220 is formed simultaneously with the semiconductor layer 1a of the TFT 30 and the gate electrode film 116 is formed simultaneously with the scanning line 3a. Moreover, the wiring lines 222a and 222b are also formed simultaneously with the data line 6a shown in FIG. 5. In addition, though not shown in FIGS. 7 to 9, a thin film may be formed simultaneously with the lower capacitor electrode 71 or the upper capacitor electrode 300. This may be used as a wiring line or the like that is electrically connected to the TFT 202.

As such, if various circuit elements, such as the TFTs 202, or wiring lines in the peripheral region have the same configuration as those in the pixel portion, the manufacturing process can be simplified or shortened, as compared to the case in which they are separately formed.

Then, in the present embodiment, in particular, the semiconductor layer 220 and the gate electrode film 116 of the TFT serving as the circuit element are electrically isolated from the wiring lines 222a and 222b by the first and second interlayer insulating films 41 and 42, like the semiconductor layer 1a of the TFT 30 and the data line 6a in the pixel portion. According to this configuration, 'an upper interlayer insulating film' according to the invention corresponds to the second interlayer insulating film 42 and 'a lower interlayer insulating film' according to the invention corresponds to the first interlayer insulating film 41. Further, 'an upper conductive layer' according to the invention corresponds to the wiring line 222a or 222b and 'a lower conductive layer' according to the invention corresponds to the semiconductor layer 220.

Then, contact holes 183 are formed from the surface of the second interlayer insulating film 42 to the surface of the semiconductor layer 220, while passing through the first and second interlayer insulating films 41 and 42. As shown in FIG. 7, the contact holes 183 are provided for the source and drain in the semiconductor layer 220.

As shown in FIGS. 7 to 9, each contact hole 183 has a first hole 185a formed in the first interlayer insulating film 41 and a plurality of second holes 185b formed from the bottom of the first hole 185a. In the contact hole 183, as shown in FIG. 7, the first hole 185a has a rectangular shape, which extends along a direction (a direction of an arrow W shown in FIG. 7) of a channel width of the TFT 202 on the source and drain of the semiconductor layer 220, as viewed from a substrate surface of the TFT array substrate 10 in plan view. Further, the first hole 185a is formed from the surface of the second interlayer insulating film 42 into the first interlayer insulating film 41 while passing through the interlayer insulating film 42, as shown in FIG. 8 or 9. Thus, the interface of the first interlayer insulating film 41 and the second interlayer insulating film 42 is disposed on a side wall of the first hole 185a in the contact hole 183.

As shown in FIG. 7, the plurality of second holes 185b formed from the bottom of the first hole 185a are arranged along the longitudinal direction of the first hole 185a, as viewed from the substrate surface of the TFT array substrate 10 in plan view. The respective second holes 185b extend from the bottom of the first hole 185a to the surface of the semiconductor layer 220 while passing through the first interlayer insulating film 41.

For example, a width D0 of the first hole 185a is formed to be 5 μm. Further, the respective second holes 185b are formed to have a diameter r0 of 2 μm and to have an distance d0 therebetween of 1.5 μm. Further, in the source and the drain of the semiconductor layer 220, the total number of second holes 185b in the contact hole 183 is, for example, 60. Moreover, in FIG. 7, the planar shape of each of the second holes 185b is shown in a circular shape, but the planar shape of each of the second holes 185b is not limited to the circular shape. Further, as viewed from the substrate surface of the TFT array substrate 10 in plan view, one second hole 185b may be formed to extend along the longitudinal direction of the first hole 185a from the bottom of the first hole 185a.

Further, with respect to the contact hole 183, the wiring line electrically connected to the source of the semiconductor layer 220 is formed as described below. Moreover, the wiring line 222b electrically connected to the drain of the semiconductor layer 220 has the same configuration as that of the wiring line 22a, and thus the description thereof will be omitted.

In FIG. 7, the wiring line 222a is formed so as to has a width D1 smaller than the width D0 of the first hole 185a and larger than the diameter r0 of the second hole 185b, as viewed from the substrate surface of the TFT array substrate 10 in plan view. Then, as shown in FIG. 8, the wiring line 222a is continuously formed along the longitudinal direction of the first hole 185a from the surface of the second interlayer insulating film 42 into the contact hole 183 so as to cover an exposed surface of the semiconductor layer 220 in the contact hole 183. Then, a stack contact is formed with a part of the wiring line 222a formed in the contact hole 183. Through such a stack contact, the source of the TFT 202 and the wiring line 222a are electrically connected to each other.

Figure 10:
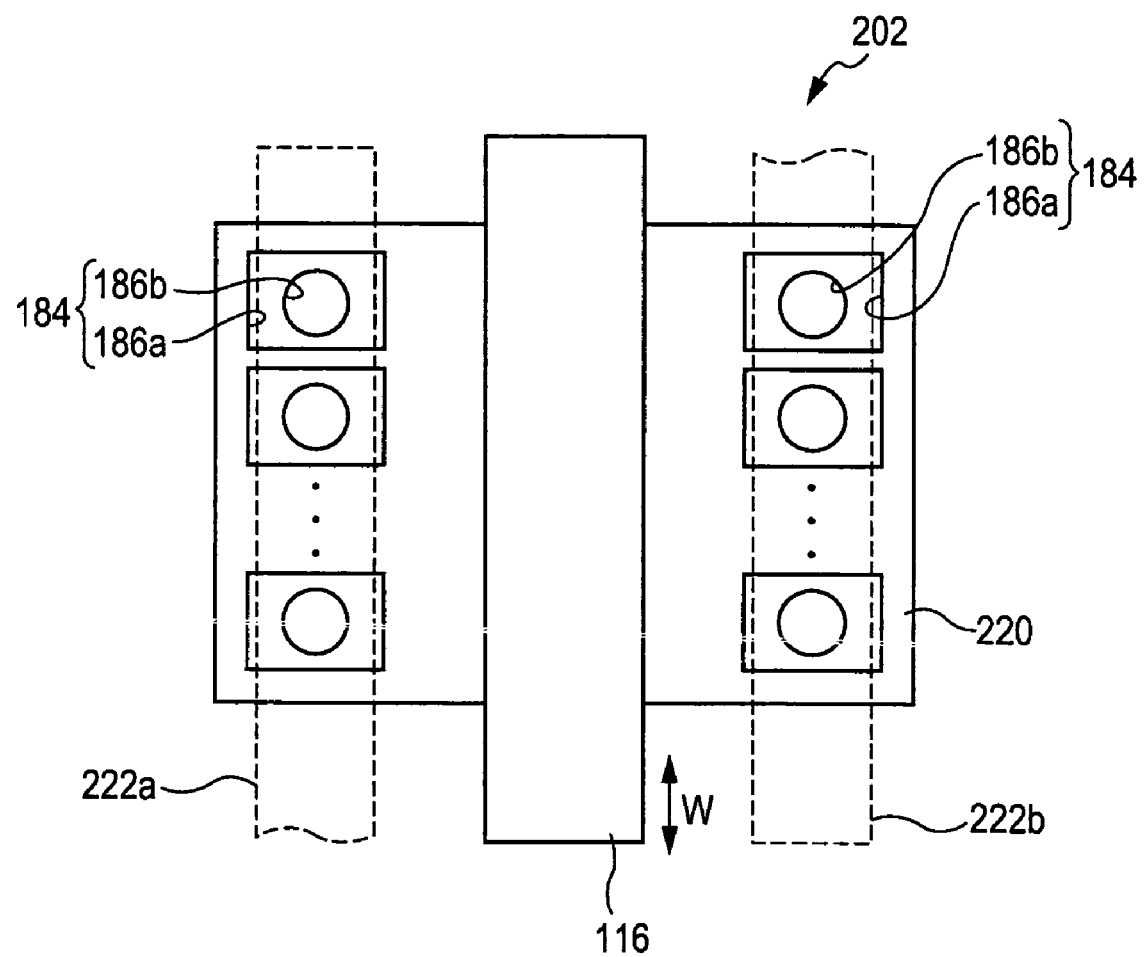
FIG. 10 is a schematic plan view showing a configuration of a single-channel-type TFT in a comparative example.
Figure 11:
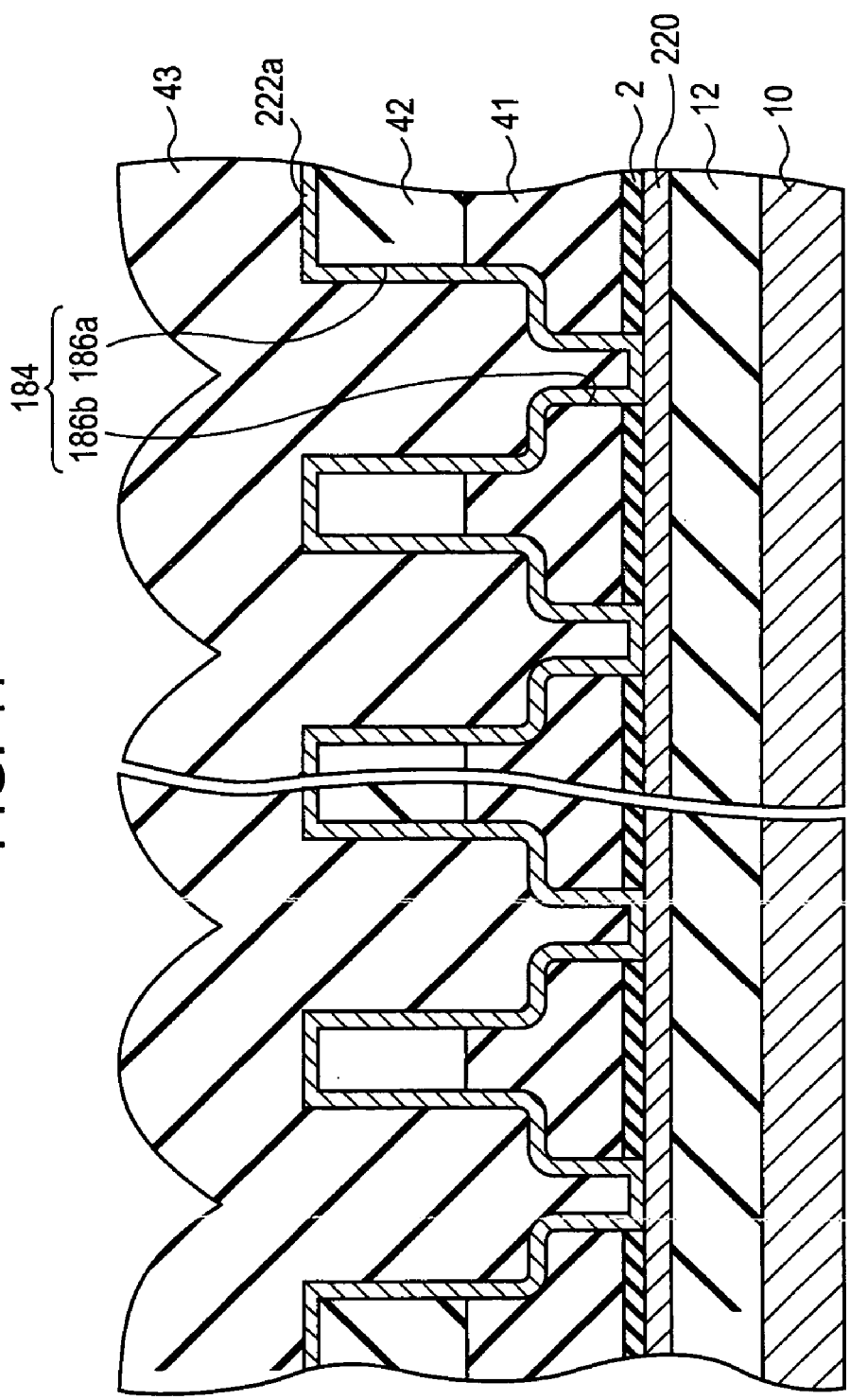
FIG. 11 is a cross-sectional view showing a configuration of a portion corresponding to a section shown in FIG. 9 in the comparative example.

Here, a configuration in which the TFT 202 and the wiring lines 222a and 222b are connected to each other with the above-described stack contact according to the related art will be described as a comparative example with reference to FIGS. 10 and 11. FIG. 10 is a schematic plan view showing a configuration of a single-channel-type TFT in the comparative example. FIG. 11 is a cross-sectional view showing a configuration of a portion corresponding to the section shown in FIG. 9, in the comparative example.

As shown in FIG. 10, a plurality of stack contacts are arranged along the direction W of the channel width of the TFT 202 with respect to the source and the drain in the semiconductor layer 202. Hereinafter, configurations of a plurality of stack contact formed with respect to the source in the semiconductor layer 220 will be described. Moreover, configurations of a plurality of stack contacts formed with respect to the drain in the semiconductor layer 220 has the same as those with respect to the source, and thus the descriptions thereof will be omitted.

The plurality of stack contacts is formed with parts of the wiring line 222a formed in contact holes 184. Further, as viewed from the substrate surface of the TFT array substrate 10 in plan view, a plurality of contact holes 184 are arranged in the channel width direction W with respect to the source in the semiconductor layer 220. The contact holes 184 extend from the surface of the second interlayer insulating film 42 to the surface of the semiconductor layer 220 while passing through the first and second interlayer insulating film 41 and 42. As shown in FIGS. 10 and 11, the respective contact holes 184 have a first hole 186a formed in the second interlayer insulating film 42 and a second hole 186b formed from the bottom of the first hole 186a. Then, the wiring line 222a is continuously formed to extend from the surface of the second interlayer insulating film 42 into the contact holes 184 so as to cover exposed surfaces of the semiconductor layer 220 in the contact holes 184.

Thus, in FIG. 11, paying attention to the parts of the wiring line 222a that form two adjacent stack contacts, the part formed in the second hole 186b of one stack contact is electrically connected to the part formed in the second hole 186b of the other stack contact via other parts formed in two first holes 186a.

On the contrary, in the present embodiment, as shown in FIG. 9, in the part of the wiring line 222a that forms the stack contact, the parts formed in two adjacent second holes 185b are continuously formed from one second hole 185b to the other second hole 185b via the bottom of the first hole 185a. Thus, in the part of the wiring line 222a that forms the stack contact, the length of a wiring line that electrically connects the parts formed in two adjacent second holes 185b to each other can be shortened, as compared to the related art. In addition, as compared to the distance between the adjacent second holes 186b in FIG. 11, the distance between two adjacent second holes 185b in FIG. 9 can be small. Thus, in consideration of this point, the length of the wiring line that electrically connects the parts formed in two adjacent second holes 185b to each other in the above-described wiring line 222a can be drastically shortened, as compared to the related art.

Therefore, in the present embodiment, the length of the wiring line 222a formed in the stack contact which is formed to pass through two layers, including the first and second interlayer insulating film 41 and 42, can be suppressed from being lengthened. In addition, as shown in FIG. 11, as compared to the comparative example in which the wiring line 222a is formed in the plurality of stack contacts, the coverage of the wiring line 222a in the stack contact can be enhanced.

Here, when the electro-optical device is driven, according to the configuration of the stack contact shown in FIGS. 7 to 9, in the part of the wiring line 222a formed in the contact hole 183, a current path from the part formed in the first hole 185a of the contact hole 183 to the semiconductor layer 220 via the parts formed in the respective second holes 185b is formed. As described above, in the present embodiment, the length of the part of the wiring line 222a formed in the stack contact can be shortened, and thus relative contact resistance between the wiring line 222a in the stack contact and a wall surface of the contact hole 183 can be reduced. Further, in the part of the wiring line 222a formed in the stack contact, excluding the second holes 185b, a current path from a side wall of the first hole 185a of the contact hole 183 to the bottom thereof can be ensured. Thus, relative resistance of the wiring line 222a in the stack contact can also be reduced. In addition, in the part of the wiring line 222a, even when a disconnection failure temporarily occurs in a part formed in some of the plurality of second holes 185b, the wiring line 222a and the semiconductor layer 220 can be electrically connected to each other via the current path formed in the portion excluding the second holes 185b, thereby obtaining a redundant wiring line effect.

Further, as described above, in the contact hole 183, the longitudinal direction of the first hole 185a is formed so as to extend along the channel width direction W. Further, the plurality of second holes 185b are arranged along the longitudinal direction of the first hole 185a. Thus, the channel width of the TFT 202 can be widened. As a result, mobility in the TFT 202 can be increased.

Accordingly, according to the present embodiment, an on current in the TFT 202 can be increased. The inventors have studied that, while the value of the on current in the TFT 202 was 550 μA in the comparative example shown in FIGS. 10 and 11, the value the on current of the TFT 202 was increased to 620 μA in the present embodiment. That is, as compared to the comparative example, in the present embodiment, the value of the on current of the TFT 202 can be increased by 14% numerically.

Here, as shown in FIG. 9, the third interlayer insulating film 43 is also formed on the wiring line 222a in the peripheral region. Though not shown in FIG. 9, the alignment film 16 shown in FIG. 5 is additionally formed on the third interlayer insulating film 43. On the surface of the third interlayer insulating film 43 formed on the wiring line 222a, an uneven shape is formed according to the surface shape of the wiring line 222a. Then, the surface shape of the third interlayer insulating film 43 is reflected in the surface shape of the alignment film 16.

In the comparative example, as shown in FIG. 11, an uneven shape formed on the surface of the third interlayer insulating film 43 formed on the wiring line 222a has a relatively large step. Thus, an uneven shape having a large step is also formed on the surface of the alignment film 16, and thus the surface of the alignment film 16 may be damaged when manufacturing of the electro-optical device or at the time of the rubbing process, such that the film may be removed.

On the other hand, in FIG. 9, in the surface of the interlayer insulating film 43 formed on the part of the wiring line 222a formed in the stack contact, the uneven step shape can be planarized. Therefore, the surface of the alignment film 16 formed on the first hole 185a in the stack contact can be relatively planarized, and thus the alignment film 16 can be prevented from being removed or damaged at the time of the rubbing process.

Moreover, if the alignment film 16 is damaged at the time of the rubbing process, display irregularity may occur on a display screen when the electro-optical device is driven. In addition, if the on current of the sampling switch 202 in the data line driving circuit 101 is reduced, the potential on each data line 6a has a value lower than a value corresponding to the image signal outputted from the image signal processing circuit 300, such that vertical line irregularity may occur on the display screen. According to the present embodiment described above, the inconsistency can be prevented from occurring, and thus a display failure in the electro-optical device can be prevented, thereby performing a high quality image display.

Further, the stack contact described with reference FIGS. 7 to 9 may be formed, for example, to electrically connect the upper conductive layer and the lower conductive layer that are electrically isolated from each other by at least one of the first interlayer insulating film 41, the second interlayer insulating film 42, and the third interlayer insulating film 43.

Alternatively, the stack contact according to the present embodiment may be applied to the pixel portions described with reference to FIGS. 4 to 6. Further, the stack contact may be applied the scanning line driving circuit 104, in addition to the data line driving circuit 101.

4: Method of Manufacturing Electro-Optical Device

Figure 12A:
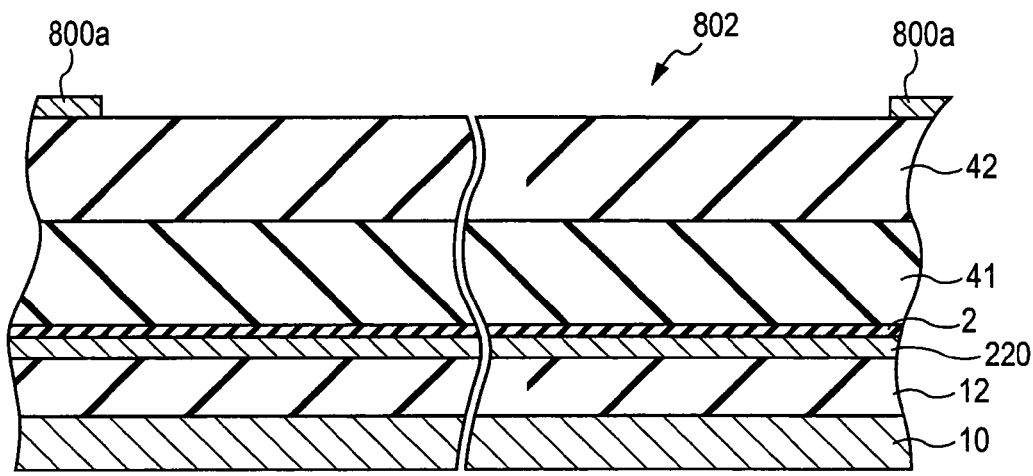
FIG. 12A is a process view sequentially showing the configuration of the section shown in FIG. 9 in respective steps of a manufacturing process according to an embodiment of the invention.
Figure 12B:
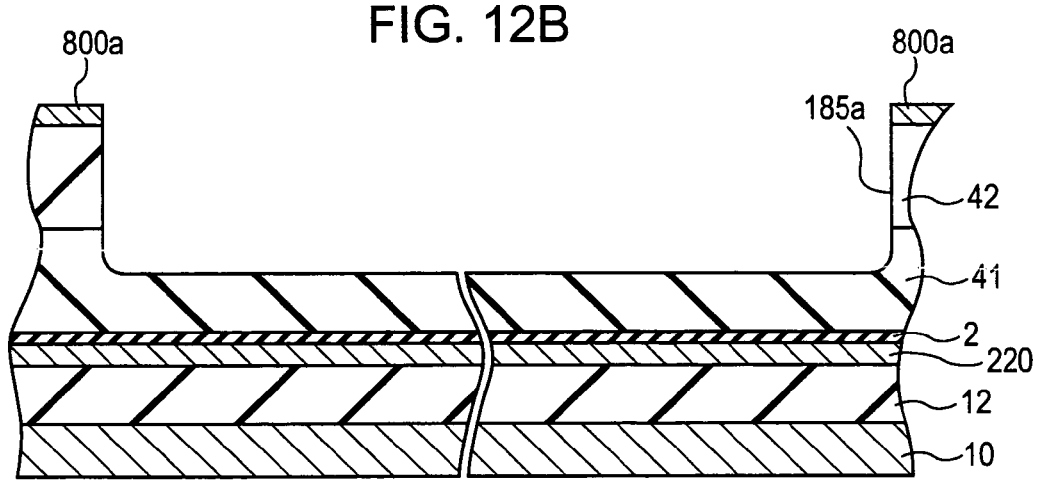
FIG. 12B is a process view sequentially showing the configuration of the section shown in FIG. 9 in the respective steps of the manufacturing process according to the embodiment of the invention.
Figure 13:
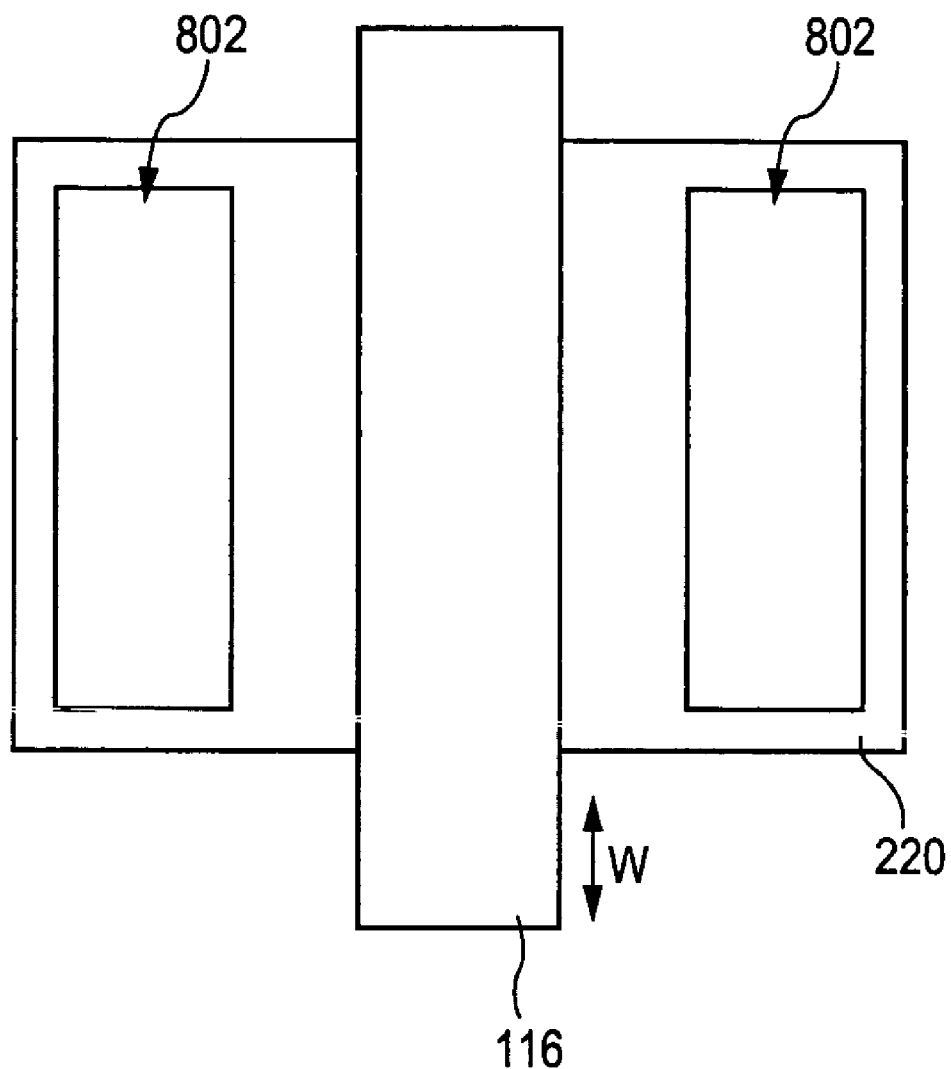
FIG. 13 is a plan view of a semiconductor layer as viewed from a substrate surface of a TFT array substrate.
Figure 14A:
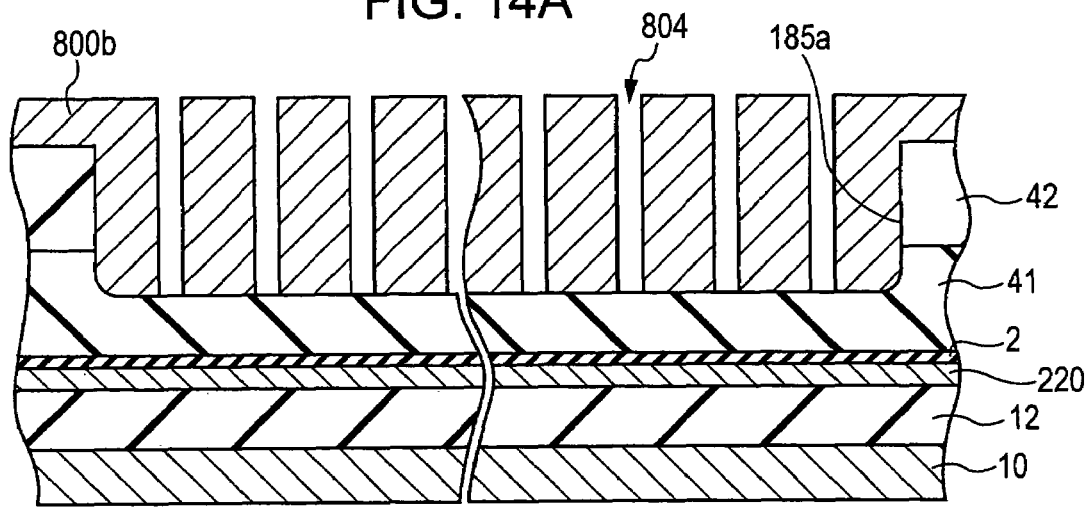
FIG. 14A is a process view sequentially showing the configuration of the section shown in FIG. 9 in the respective steps of the manufacturing process according to the embodiment of the invention.
Figure 14B:
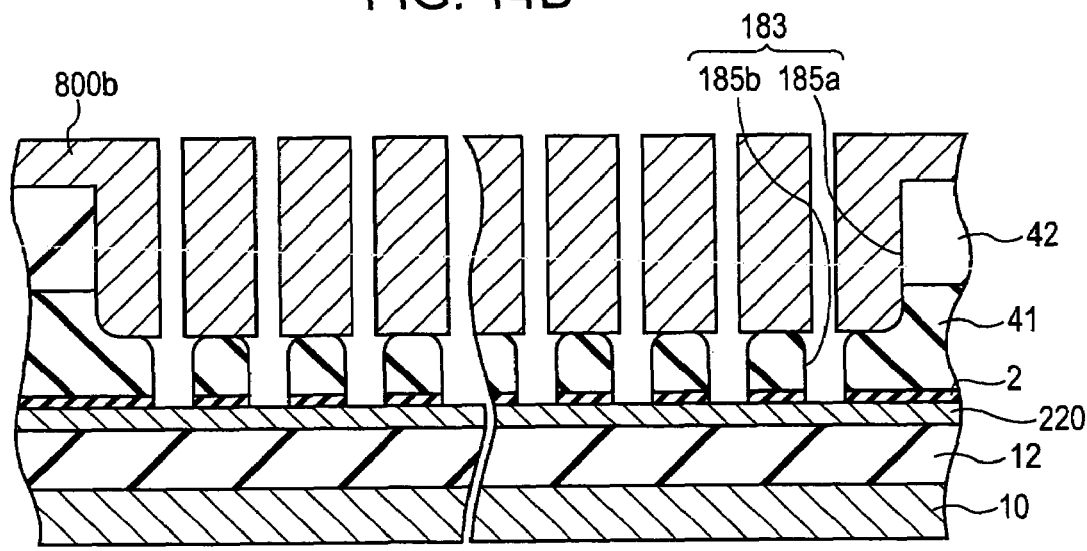
FIG. 14B is a process view sequentially showing the configuration of the section shown in FIG. 9 in the respective steps of the manufacturing process according to the embodiment of the invention.
Figure 15:
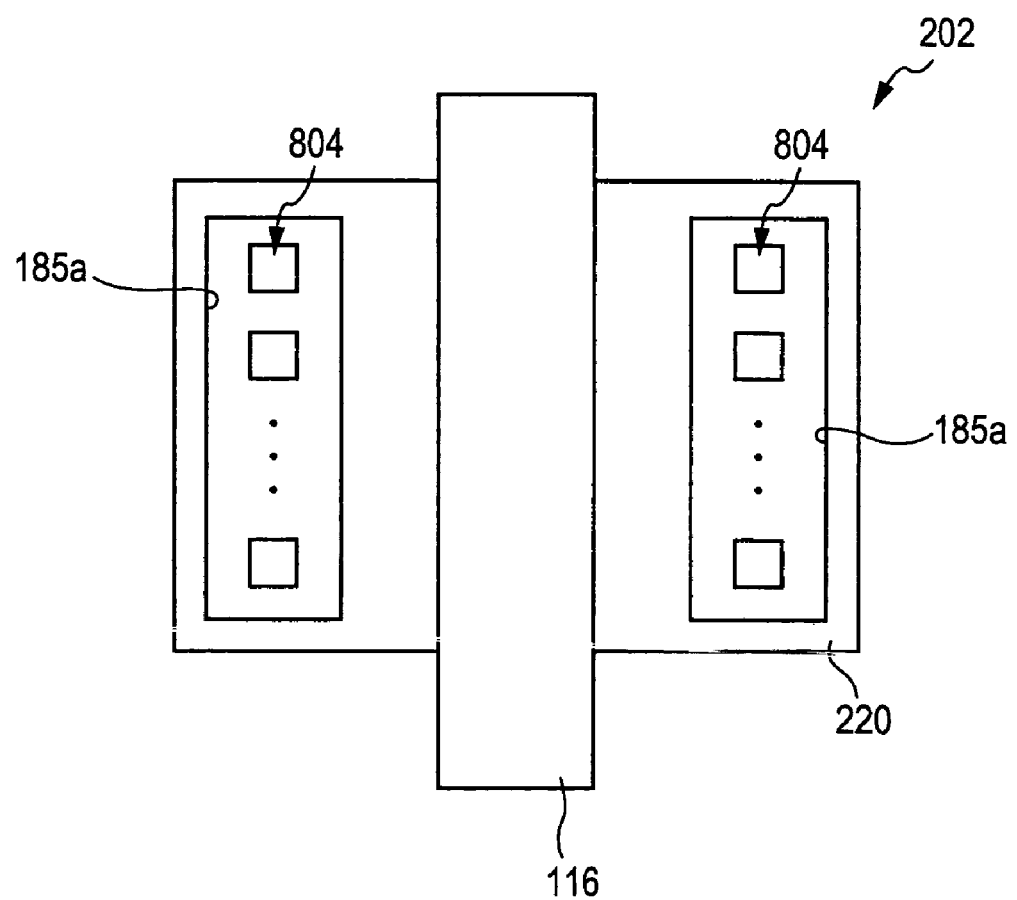
FIG. 15 is a plan view of the semiconductor layer as viewed from the substrate surface of the TFT array substrate.

A manufacturing process of the above-described electro-optical device will be described with reference to FIGS. 12A to 15. FIGS. 12A and 12B are process views sequentially showing the configuration of the section shown in FIG. 9 in respective steps of the manufacturing process. FIG. 13 is a plan view of the semiconductor layer 220 as viewed from the substrate surface of the TFT array substrate 10, for explaining the sequence regarding the formation of the first hole. FIGS. 14A and 14B are process views sequentially showing the configuration of the section in the respective steps of the manufacturing process, subsequent to FIGS. 12A and 12B. FIG. 15 is a plan view of the semiconductor layer 220 as viewed from the substrate surface of the TFT array substrate 10, for explaining the sequence regarding the formation of the second holes.

Moreover, hereinafter, only the formation of the stack contact that connects the wiring lines 222a and 222b of the peripheral region to the semiconductor layer 220 as the feature of the present embodiment will be described. The description about the manufacturing process of the scanning line 3a, the semiconductor layer 1a, the gate electrode 3a, the storage capacitor 70, and the data line 6a will be omitted.

In FIG. 12A, in the peripheral region on the TFT array substrate 10, the base insulating film 12 or the TFT 202 is formed. Then, on the TFT 202, the first interlayer insulating film 41 and the second interlayer insulating film 42 are formed. The first interlayer insulating film 41 is made of, for example, a silicate glass film, such as non-doped silicate glass (NSG) or borophosphosilicate glass (BPSG) by a normal pressure or reduced pressure chemical vapor deposition (CVD) method using a TEOS gas. Further, on the first interlayer insulating film 41, the second interlayer insulating film 42 made of a silicate glass film, such as MNSG, NSG, or BPSG, is formed by a normal pressure or reduced pressure CVD method.

Then, on the second interlayer insulating film 49, for example, a resist 800a is formed and patterned by using a photolithography method, such that an opening portion 802 is formed at a place corresponding to the formation position of the first hole 185a. Here, FIG. 13 shows an arrangement relationship between the semiconductor layer 220 and the gate electrode film 116, and the opening portion 802 of the resist 800a. The opening portion 802 is formed so as to have a rectangular shape that extends in the direction W of the channel width of the TFT 202, as viewed from the substrate surface of the TFT array substrate 10 in plan view.

Next, in FIG. 12B, an etching process is performed on the first interlayer insulating film 41 and the second interlayer insulating film 42 via the opening portion 802 of the resist 800a by a dry etching method so as to form the first hole 185a. As such, the etching process is performed only by the dry etching method and thus the resist 800a can be prevented from being removed. Further, the bottom of the first hole 185a is disposed in the first interlayer insulating film 41 and the part of the side wall of the first hole 185a is disposed in the interface of the first interlayer insulating film 41 and the second interlayer insulating film 42.

Next, after the resist 800a is removed, in FIG. 14A, a new resist 800b is formed on the surface of the second interlayer insulating film 42 and patterned by using the photolithography method, such that opening potions 804 are formed to correspond to the formation positions of the second holes 185b in the bottom of the first hole 185a. Here, FIG. 15 shows an arrangement relationship among the shapes of the opening portions 804, the opening portions 804, and the first hole 185a. The plurality of second holes 185b are arranged along the longitudinal direction of the first hole 185a within the first hole 185a as viewed from the substrate surface of the TFT array substrate 10 in plan view. Then, in addition to the part of the side wall of the first hole 185a disposed in the interface of the first interlayer insulating film 41 and the second interlayer insulating film 42, the surface of the second interlayer insulating film 42 is covered with the resist 800b.

Next, in FIG. 14B, an etching process is performed on the first interlayer insulating film 41 by using a wet etching method or by using the dry etching method and the wet etching method, such that the second holes 185b are formed so as to pass through the first interlayer insulating film 41 and the insulating film 2 from the exposed bottom of the first hole 185a in the opening portions 804 of the resist 800b. Accordingly, the contact hole 183 is formed so as to extend from the surface of the second interlayer insulating film 42 to the surface of the semiconductor layer 220 while passing through the second interlayer insulating film 42 and the first interlayer insulating film 41. At this time, the part of the side wall of the first hole 185a disposed in the interface of the first interlayer insulating film 41 and the second interlayer insulating film 42 is protected by the resist 800b. Thus, for example, even when the first interlayer insulating film 41 is made of the NSG film and the second interlayer insulating film 42 is made of the BPSG film having an etching rate to an etchant lower than that of the NSG film, the interface can be prevented from being narrowed due to the penetration of the etchant into the interface of the first interlayer insulating film 41 and the second interlayer insulating film 42. Further, the plurality of second holes 185b are formed from the bottom of the first hole 185a by the wet etching method, in addition to the dry etching method, and thus the semiconductor layer 220 can be prevented from being removed or damaged.

Next, after the resist 800b is removed from the surface of the second interlayer insulating film 42, a conductive film is film-formed, for example, by using a sputtering method and is patterned, for example, by using a photolithography method and an etching method, such that the wiring lines 222a and 222b are formed.

Thus, as shown in FIG. 14B, for example, in the contact hole 183 in a state in which the part of the side wall thereof disposed in the interface of the first interlayer insulating film 41 and the second interlayer insulating film 42 is not narrowed, the part of the wiring line 222a is formed near the source of the semiconductor layer 220. Thus, the disconnection failure of the wiring line 222a or 222b in the contact hole 183 can be prevented, such that the yield in the manufacturing process of the electro-optical device can be enhanced.

5: Modification

A modification of the above-described present embodiment will be described with reference to FIGS. 16A to 19B.

First, a modification about the formation of the stack contact described with reference to FIGS. 12A to 15 will be described with reference to FIGS. 16A to 18. FIGS. 16A to 17B are process views sequentially showing the configuration of the section shown in FIG. 9 in respective steps of a manufacturing process according to the modification. FIG. 18 is a plan view of the semiconductor layer 220 as viewed from the substrate surface of the TFT array substrate 10 in plan view, for explaining the sequence regarding the formation of the first hole.

Figure 16A:
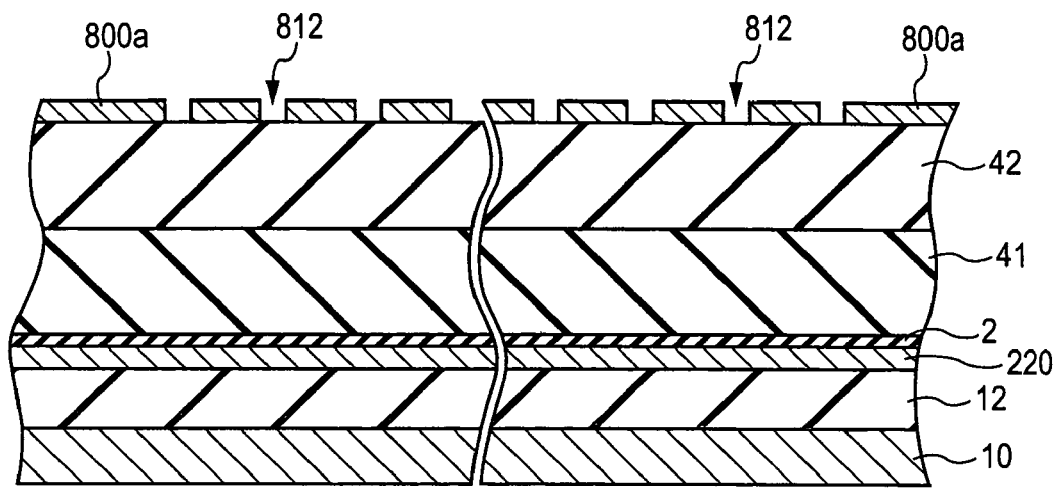
FIG. 16A is a process view sequentially showing the configuration of the section shown in FIG. 9 in respective steps of a manufacturing process according to a modification of the invention.

First, in FIG. 16A, on the second interlayer insulating film 42, for example, a resist 800a is formed and patterned, such that opening portions 812 are formed at places corresponding to the formation positions of the second holes 185b.

Figure 16B:
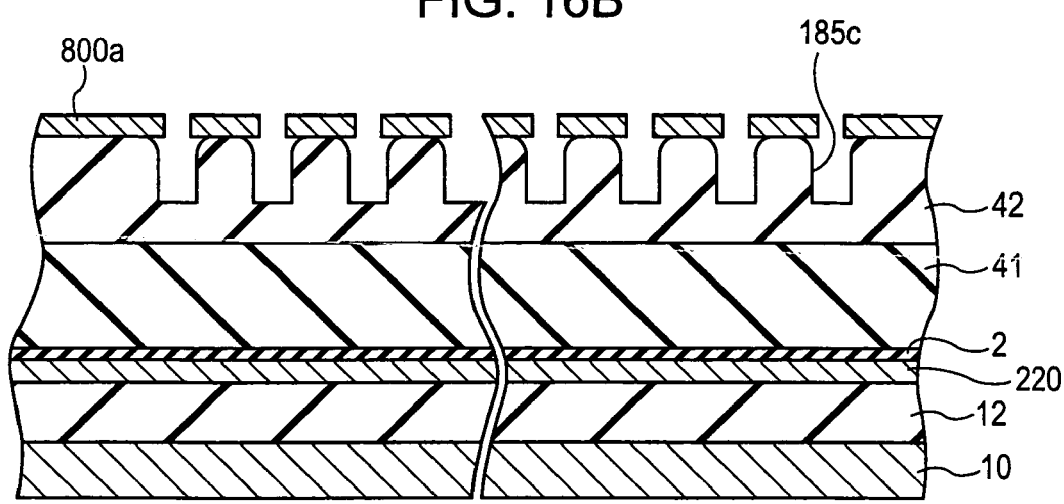
FIG. 16B is a process view sequentially showing the configuration of the section shown in FIG. 9 in the respective steps of the manufacturing process according to the modification of the invention.

Next, in FIG. 16B, an etching process is performed on the second interlayer insulating film 42 via the opening portions 812 of the resist 800a by using a wet etching method or by using a dry etching method and a wet etching method, such that the plurality of small holes 185c are formed.

Figure 17A:
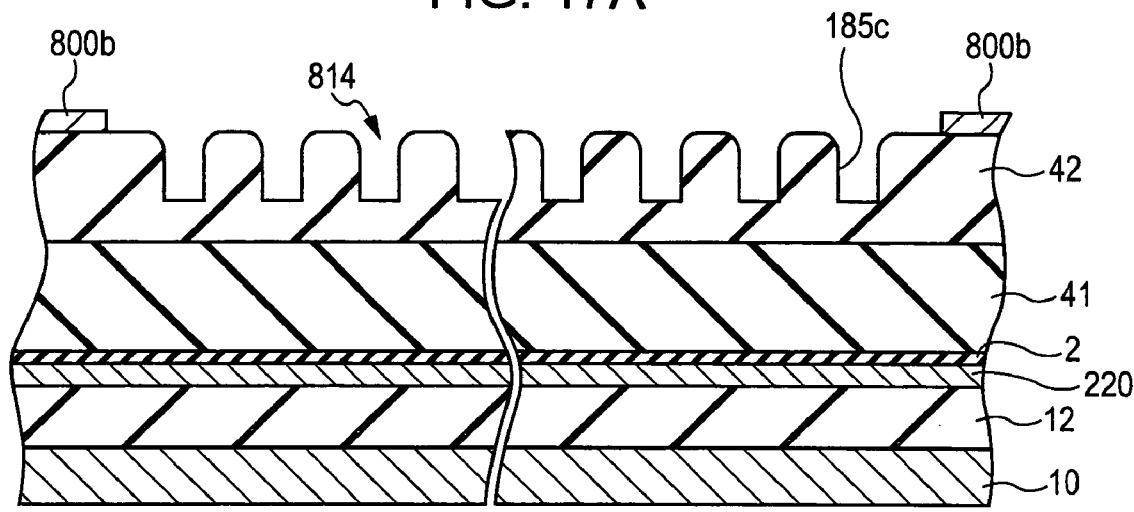
FIG. 17A is a process view sequentially showing the configuration of the section shown in FIG. 9 in the respective steps of the manufacturing process according to the modification of the invention.
Figure 18:
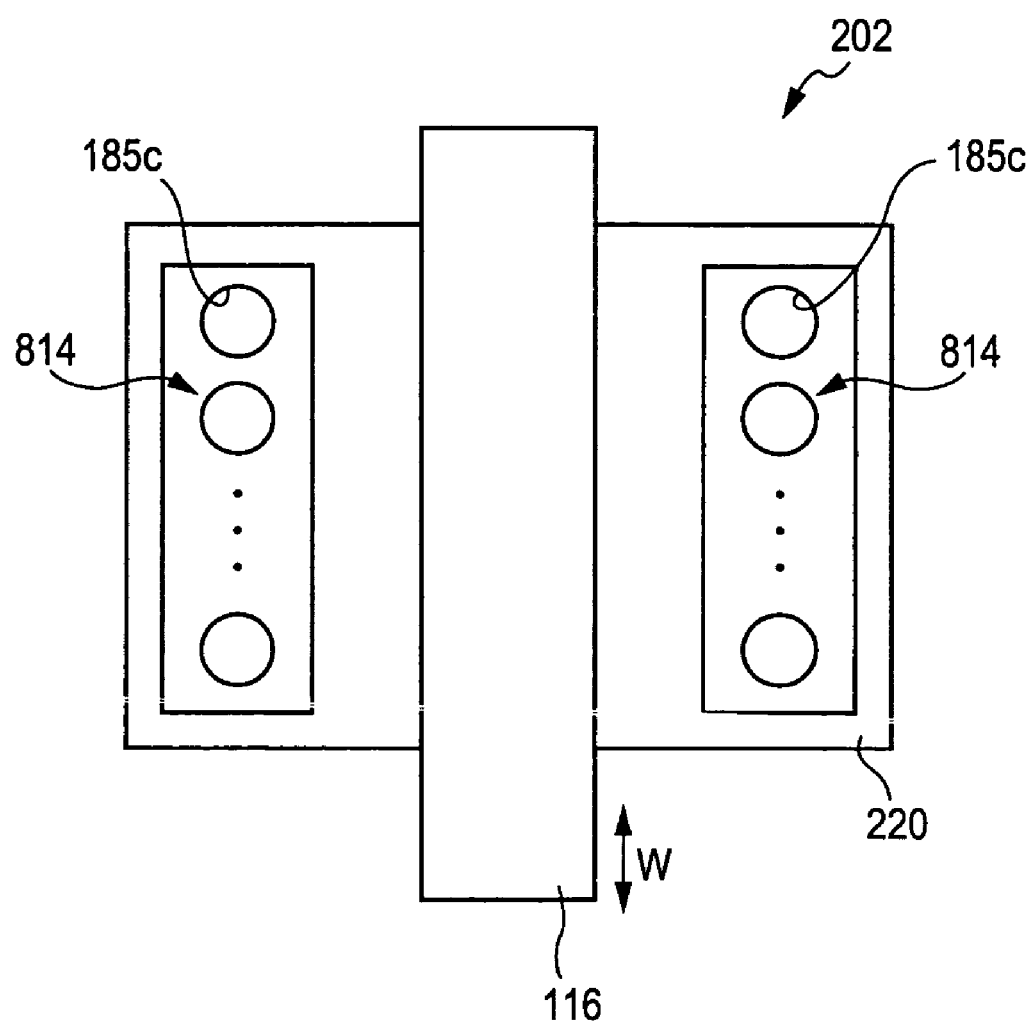
FIG. 18 is a plan view of a semiconductor layer as viewed from the substrate surface of the TFT array substrate.

Next, after the resist 800a is removed, in FIG. 17A, a new resist 800b is formed on the surface of the second interlayer insulating film 42 and patterned, such that an opening portion 814 is formed so as to correspond to the formation position of the first hole 185a. Here, FIG. 18 shows an arrangement relationship among the shape of the opening portion 814 of the resist 800b, the opening portion 814, and the plurality of small holes 185c. The plurality of small holes 185c are respectively arranged along the channel width direction W near the source and the drain of the TFT 202, as viewed from the substrate surface of the TFT array substrate 10 in plan view. Further, the planar shape of the opening portion 814 is a rectangular shape that is formed so as to extend in a longitudinal shape along the channel width direction W and to surround the plurality of small holes 185c.

Figure 17B:
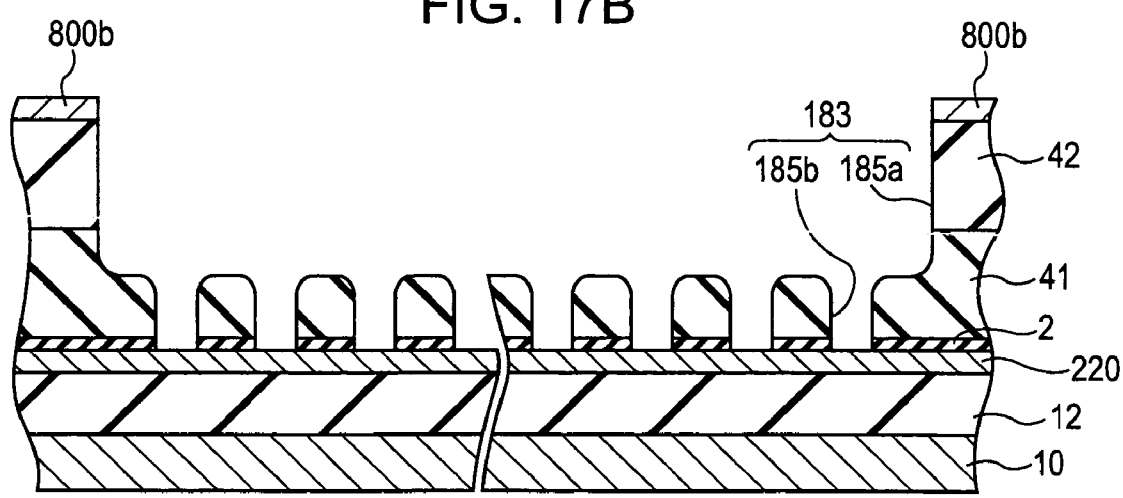
FIG. 17B is a process view sequentially showing the configuration of the section shown in FIG. 9 in the respective steps of the manufacturing process according to the modification of the invention.

Next, in FIG. 17B, an etching process is performed on the first interlayer insulating film 41 and the second interlayer insulating film 42 via the opening portion 814 of the resist 800b by using the dry etching method, such that the first hole 185a is formed and the plurality of small holes 185c are further cut so as to the second holes 185b. As such, the contact hole 183 is formed so as to extend from the surface of the second interlayer insulating film 42 to the surface of the semiconductor layer 220 while passing through the second interlayer insulating film 42 and the first interlayer insulating film 41.

Accordingly, as described above, even when the contact hole 183 of the stack contact is formed, the first hole 185a is formed by using the dry etching method. Thus, the resist 800b can be prevented from being removed.

Figure 19A:
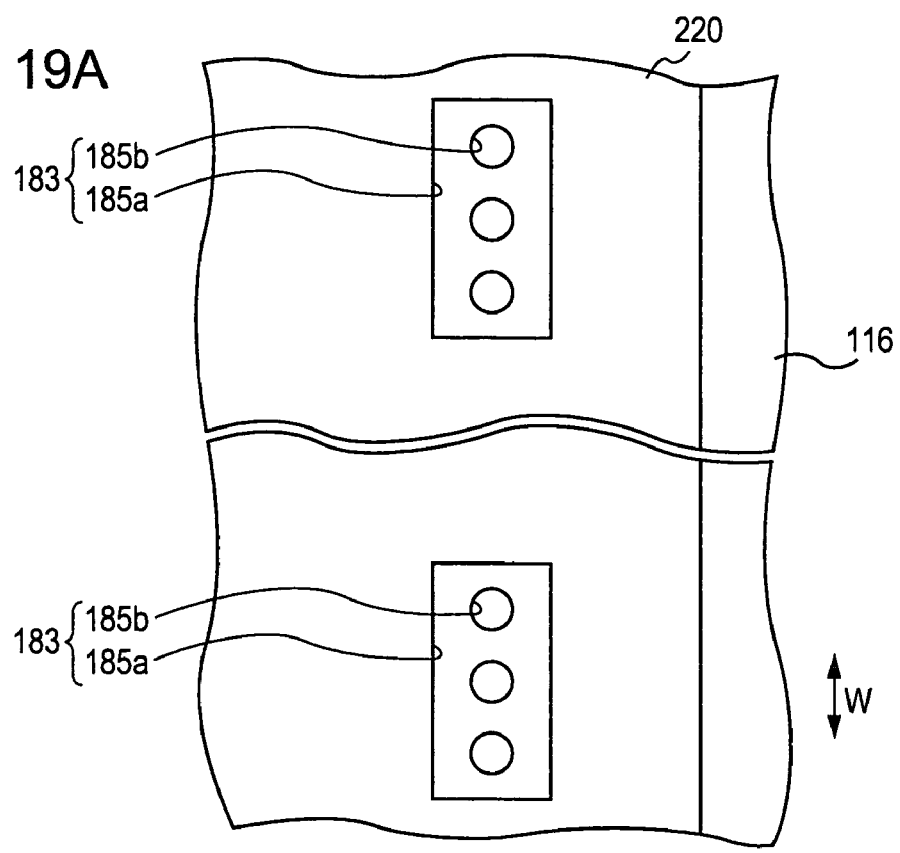
FIG. 19A is a plan view showing a configuration of a contact hole in the modification as viewed from the substrate surface of the TFT array substrate.
Figure 19B:
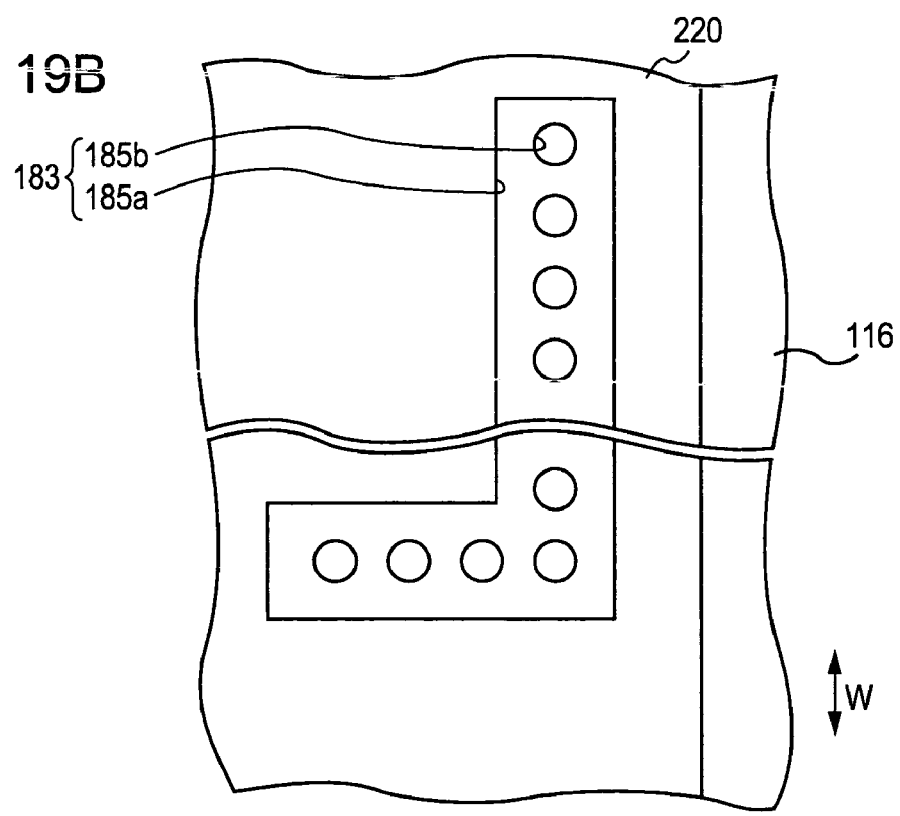
FIG. 19B is a plan view showing a configuration of a contact hole in the modification as viewed from the substrate surface of the TFT array substrate.

Next, a modification regarding a configuration of the contact hole 183 in the stack contact will be described with reference of FIGS. 19A and 19B. FIGS. 19A and 19B are plan views showing the configuration of the contact hole 183 as viewed from the substrate surface of the TFT array substrate 10 in the present modification.

As shown in FIG. 19A, a plurality of contact holes 183 may be formed on the semiconductor layer 220. For example, the plurality of contact holes 183 are arranged along the channel width direction W near the source of the TFT 202. As such, when the plurality of contact holes 183 are formed and when a resist is formed so as to form the first hole 185a of each of the contact holes 183, during the exposure step of the resist film, the transfer of a mask for forming an opening pattern may be not normally performed. Thus, it is necessary to sufficiently ensure the distance between the contact holes 183 in the arrangement direction thereof.

With respect to the configuration shown in FIG. 19A, as described with reference to FIGS. 7 to 9, if one contact hole 183 is formed near the source or drain of the TFT 202, when the contact hole 183 is formed, the above-described inconsistency does not occur. Thus, with the TFT 202 having a reduced size, the data line driving circuit 101 can be reduced in size. As a result, the liquid crystal device can be reduced in size. In addition, for example, as compared to the case in which the wiring line 222a is continuously formed over the plurality of contact holes 183 shown in FIG. 19A near the source of the TFT 202, the part of the wiring line 222a for forming the stack contact has a minimum length, and thus relative resistance can be suppressed low.

Further, as shown in FIG. 19B, the planar shape of the first hole 185a in the contact hole 183 is not limited to the rectangular shape, and the first hole 185a may be formed in a shape including a linear portion extending along the channel width direction W and a curved portion bent from the linear portion. If doing so, for example, the shape of the wiring line 222a or 222b can be changed into a shape according to the contact hole 183. Thus, it is advantageous to reduce the size of the TFT 202 and also to reduce the size of the data line driving circuit 101.

6: Electronic Apparatus

Next, cases in which the liquid crystal device, such as the above-described electro-optical device, is applied to various electronic apparatuses will be described.

6-1: Projector

Figure 20:
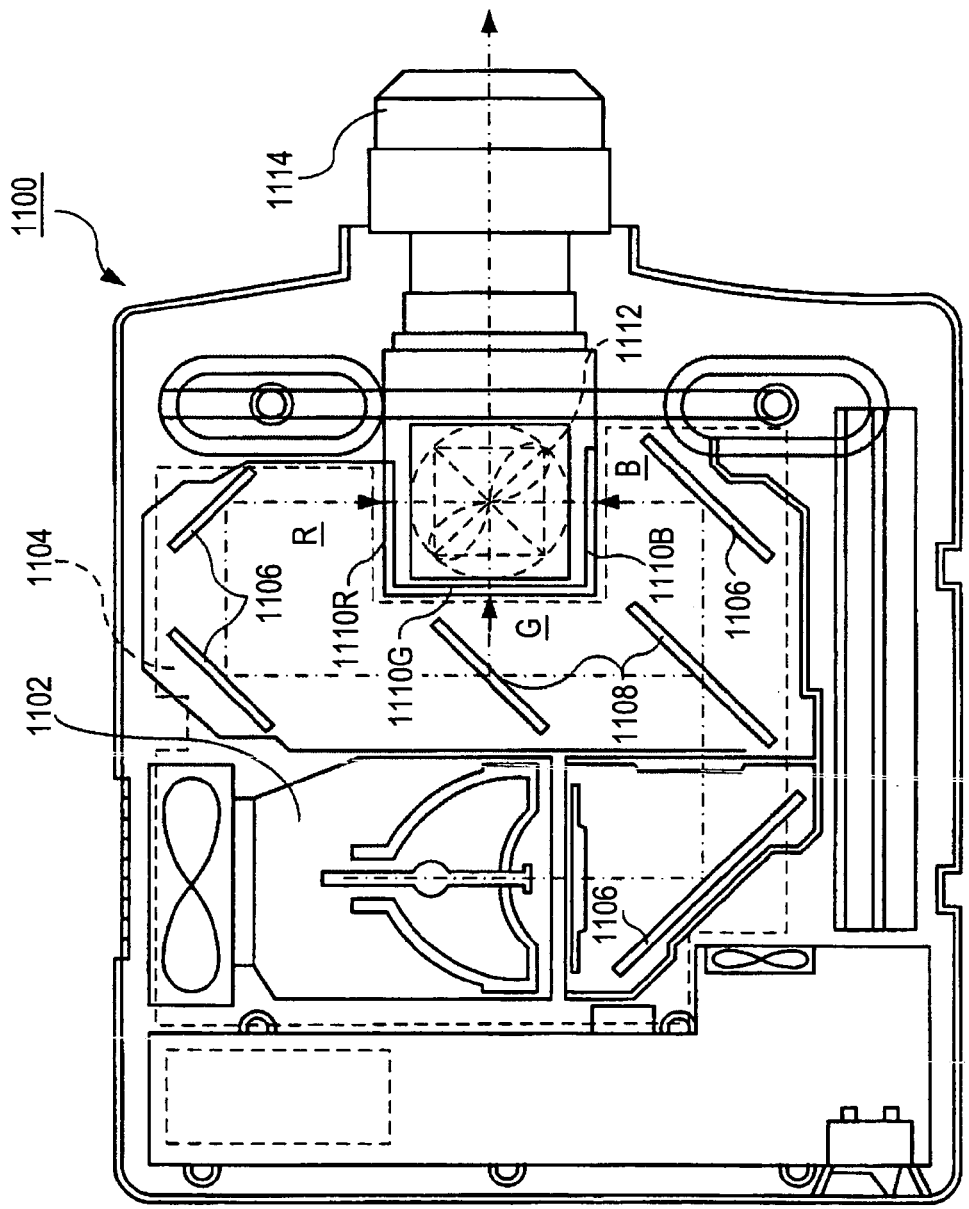
FIG. 20 is a plan view showing a configuration of a projector as an example of an electronic apparatus to which a liquid crystal device is applied.

First, a projector that uses the liquid crystal device as a light valve will be described. FIG. 20 is a plan view showing an example of the configuration of the projector. As shown in FIG. 20, the projector 1100 includes a lamp unit 1102 having a white light source such as a halogen lamp. Light projected from the lamp unit 1102 is divided into three primary color light components of RGB by four mirrors 1106 and two dichroic mirrors 1108 provided in a light guide 1104. The three primary color light components enter liquid crystal panels 1110R, 1110G, and 1110B, respectively, which serve as light valves corresponding to the respective primary colors.

The configuration of each of the liquid crystal panels 1110R, 1110G, and 1110B is the same as that of the above-described liquid crystal device, which the signals for the primary colors, R, G, and B supplied from an image signal processing circuit are driven, respectively. The light components modulated by the liquid crystal panels enter a dichroic prism 1112 from three directions. In the dichroic prism 1112, the light components of R and B are refracted at an angle of 90 degrees, while the light component of G travels in a straight line. Thus, images of the respective colors are combined and color images are projected through a projection lens 1114, for example, onto a screen.

Here, paying attention to the display images by the respective liquid crystal panels 1110R, 1110G, and 1110B, a display image formed by the liquid crystal panel 1110G must be horizontally reversed to the display images formed by the liquid crystal panels 1110R and 1110B.

Moreover, since the light components corresponding to the three primary colors of R, G, and B enter the liquid crystal panels 1110R, 1110B, and 1110G by the dichroic mirrors 1108, color filters need not be provided.

6-2: Mobile Computer

Figure 21:
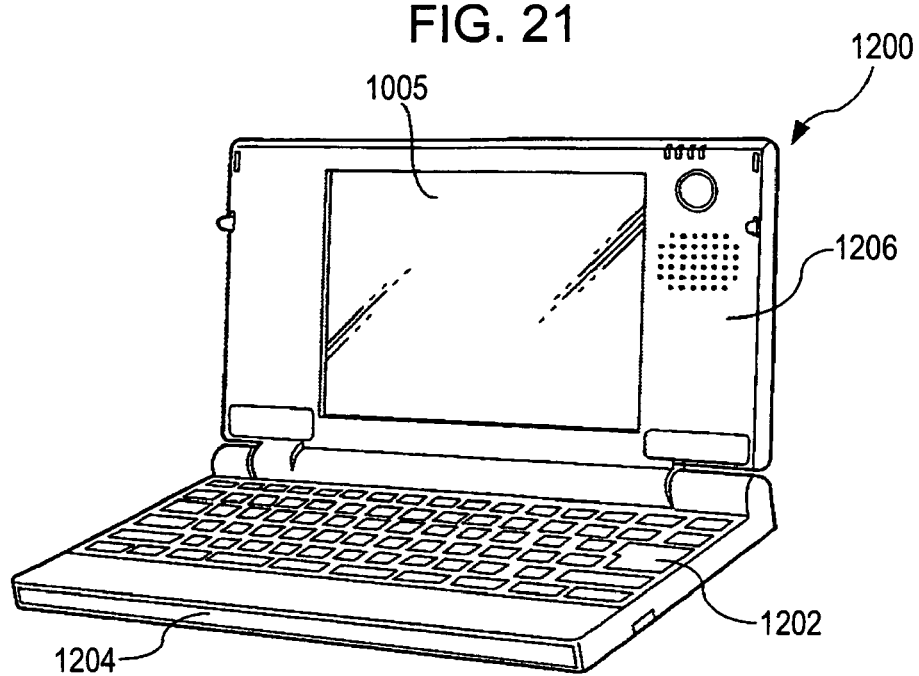
FIG. 21 is a perspective view showing a configuration of a personal computer as another example of an electronic apparatus to which a liquid crystal device is applied.

Next, an example in which the liquid crystal device is applied to a mobile personal computer will be described. FIG. 21 is a perspective view showing the configuration of the personal computer. In FIG. 21, the computer 1200 includes a main unit 1204 including a keyboard 1202 and a liquid crystal display unit 1206. The liquid crystal display unit 1206 is formed by providing a back light on the rear surface of the liquid crystal device 1005.

6-3: Cellular Phone

Figure 22:
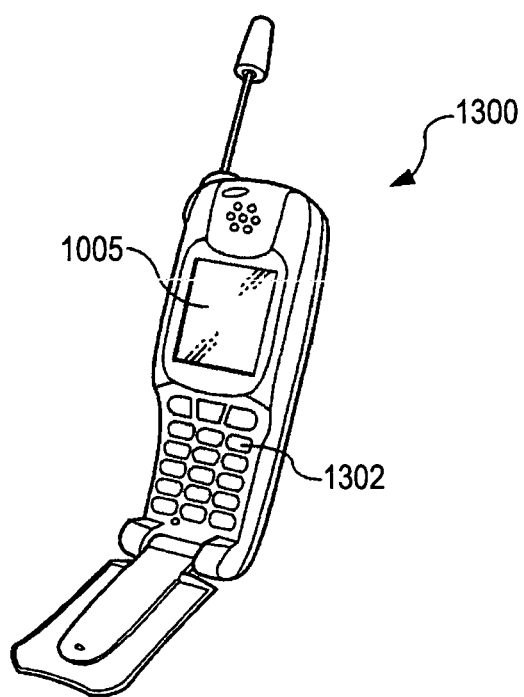
FIG. 22 is a perspective view showing a configuration of a cellular phone as still another example of an electronic apparatus to which a liquid crystal device is applied.

Next, an example in which the liquid crystal device is applied to a cellular phone will be described. FIG. 22 is a perspective view showing the configuration of the cellular phone. In FIG. 22, the cellular phone 1300 includes a plurality of operation buttons 1302 and a reflective liquid crystal device 1005. In the reflective liquid crystal device 1005, a front light is provided on the front surface thereof, if necessary.

Moreover, in addition to the electronic apparatuses described with reference to FIGS. 20 to 22, a liquid crystal television, a view-finder-type or monitor-direct-view-type video tape recorder, a car navigation device, a pager, an electronic organizer, an electronic calculator, a word processor, a work station, a video phone a POS terminal, and a device including a touch panel can be exemplified. It is needless to say that the liquid crystal device can be applied to these electronic apparatuses.

It should be understood that the invention is not limited to the above-described embodiment, and modifications can be made within the scope without departing from the subject matter or spirit of the invention as defined by the appended claims and the entire specification. Therefore, a substrate for a semiconductor device, a manufacturing method thereof, a substrate for an electro-optical device having the substrate for a semiconductor device, an electro-optical device having the substrate for an electro-optical device, and an electronic apparatus having the electro-optical device that accompany such modifications still fall within the technical scope of the invention.

What is claimed is:

1. A substrate for a semiconductor device comprising:
   a substrate;
   a thin film transistor that is provided on the substrate;
   a wiring line that is provided above the thin film transistor;
   an interlayer insulating film that electrically isolates the wiring line from at least a semiconductor layer of the thin film transistor, the interlayer insulating film being formed with a first hole extending in a longitudinal direction in plan view on a substrate surface, the interlayer insulating film being formed with a plurality of second holes passing through a bottom of the first hole to reach a surface of the semiconductor layer, the plurality of second holes being arranged within the first hole in plan view and in the longitudinal direction of the first hole; and
   a contact hole including the first hole and the plurality of second holes, the contact hole connecting the wiring line to the semiconductor layer through the interlayer insulating film.

2. The substrate for a semiconductor device according to claim 1,
   wherein the wiring line is continuously formed along the longitudinal direction from a surface of the interlayer insulating film into the contact hole so as to cover an exposed surface of the semiconductor layer in the contact hole.

3. The substrate for a semiconductor device according to claim 2,
   wherein a width of the part of the wiring line continuously formed along the longitudinal direction is smaller than a width of the first hole in the contact hole and is larger than a width of each of the second holes in plan view on the substrate surface.

4. The substrate for a semiconductor device according to claim 1,
   wherein the longitudinal direction extends along the direction of the channel width of the semiconductor layer.

5. The substrate for a semiconductor device according to claim 1,
   wherein the contact hole is formed near a source or a drain of the thin film transistor.

6. The substrate for a semiconductor device according to claim 1,
   wherein the interlayer insulating film is formed so as to have two layers or more.

7. The substrate for a semiconductor device according to claim 6,
   wherein a lower interlayer insulating film and an upper interlayer insulating film disposed above the lower interlayer insulating film are formed such that the interface of the lower interlayer insulating film and the upper interlayer insulating film is disposed higher than the bottom of the first hole in the contact hole.

8. A substrate for a semiconductor device comprising:
   a substrate;
   a lower conductive layer that is provided on the substrate;
   an upper conductive layer that is provided above the lower conductive layer;
   an interlayer insulating film that electrically isolates the upper conductive layer from the lower conductive layer, the interlayer insulating film being formed with a first hole extending in a longitudinal direction in plan view on a substrate surface, the interlayer insulating film being formed with a plurality of second holes passing through a bottom of the first hole to reach a surface of the lower conductive layer, the plurality of second holes being arranged within the first hole in plan view and in the longitudinal direction of the first hole; and
   a contact hole including the first hole and the plurality of second holes, the contact hole connecting the upper conductive layer to the lower conductive layer through the interlayer insulating film.

9. The substrate for a semiconductor device according to claim 8,
   wherein the upper conductive layer is continuously formed in the longitudinal direction from a surface of the interlayer insulating film into the contact hole so as to cover an exposed surface of the lower conductive layer in the contact hole.

* * * * *